(12) United States Patent
Lee et al.

(10) Patent No.: US 12,519,879 B2
(45) Date of Patent: Jan. 6, 2026

(54) ANTENNA AND ELECTRONIC APPARATUS INCLUDING SAME

(71) Applicant: Samsung Electronics Co., Ltd., Suwon-si (KR)

(72) Inventors: Hyungjoo Lee, Suwon-si (KR); Gyusub Kim, Suwon-si (KR); Hosaeng Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 272 days.

(21) Appl. No.: 18/189,772

(22) Filed: Mar. 24, 2023

(65) Prior Publication Data

US 2023/0239385 A1    Jul. 27, 2023

Related U.S. Application Data

(63) Continuation of application No. PCT/KR2021/013001, filed on Sep. 24, 2021.

(30) Foreign Application Priority Data

Oct. 7, 2020    (KR) .................. 10-2020-0129571

(51) Int. Cl.
 *H04M 1/02*    (2006.01)
 *H01Q 1/24*    (2006.01)
(52) U.S. Cl.
 CPC .......... *H04M 1/0277* (2013.01); *H01Q 1/243* (2013.01)
(58) Field of Classification Search
 CPC .............................. H04M 1/0277; H01Q 1/243
 (Continued)

(56) References Cited

U.S. PATENT DOCUMENTS 9,762,710 B2    9/2017 Lee et al.
10,038,234 B2    7/2018 Tseng et al.
(Continued)

FOREIGN PATENT DOCUMENTS

CN    110165373 A    8/2019
EP    3 293 817 A1    3/2018
(Continued)

OTHER PUBLICATIONS

International Search Report dated Jan. 3, 2022, issued in International Patent Application No. PCT/KR2021/013001.
(Continued)

*Primary Examiner* — Michael R Neff
(74) *Attorney, Agent, or Firm* — Jefferson IP Law, LLP

(57) ABSTRACT

An electronic apparatus is provided. The electronic device includes a lateral member including a first conductive part disposed between a first non-conductive part formed on a first lateral surface and a second non-conductive part formed on a second lateral surface, a second conductive part disposed between the first non-conductive part and a third non-conductive part formed on a third lateral surface, and a third conductive part disposed on the second lateral surface and facing the first conductive part, a wireless communication circuit electrically connected to a first point of the first conductive part, a first switching circuit for electrically connecting the wireless communication circuit to a second point of the second conductive part, a second switching circuit for connecting the first conductive part to the third conductive part, and at least one processor for controlling the first switching circuit and the second switching circuit.

20 Claims, 17 Drawing Sheets

(58) Field of Classification Search
USPC .......................................................... 455/560
See application file for complete search history.

(56) References Cited

U.S. PATENT DOCUMENTS

| | | | |
|---|---|---|---|
| 10,186,752 | B2 | 1/2019 | Chen et al. |
| 10,218,065 | B2 | 2/2019 | Lee et al. |
| 10,389,026 | B2 | 8/2019 | An et al. |
| 10,403,967 | B1 | 9/2019 | Kim et al. |
| 10,644,758 | B2 | 5/2020 | Irci et al. |
| 2017/0047641 | A1 | 2/2017 | Kim et al. |
| 2018/0069301 | A1 | 3/2018 | Choi et al. |
| 2018/0166769 | A1 | 6/2018 | Chang et al. |
| 2018/0277934 | A1 | 9/2018 | Kim et al. |
| 2019/0067797 | A1 | 2/2019 | Jung et al. |
| 2019/0081386 | A1 | 3/2019 | Edwards et al. |
| 2019/0165870 | A1* | 5/2019 | Uno ................ H01Q 21/28 |
| 2019/0260126 | A1 | 8/2019 | Vazquez et al. |
| 2020/0044311 | A1 | 2/2020 | Gu et al. |
| 2020/0119429 | A1 | 4/2020 | Park et al. |
| 2020/0321988 | A1 | 10/2020 | Kim et al. |
| 2022/0311127 | A1 | 9/2022 | Li et al. |

FOREIGN PATENT DOCUMENTS

| | | |
|---|---|---|
| EP | 3 716 587 A1 | 9/2020 |
| KR | 10-2018-0027802 A | 3/2018 |
| KR | 10-2018-0108147 A | 10/2018 |
| KR | 10-2019-0033507 A | 3/2019 |
| KR | 10-2019-0114630 A | 10/2019 |
| KR | 10-2020-0042611 A | 4/2020 |

OTHER PUBLICATIONS

Extended European Search Report dated Feb. 7, 2024, issued in European Application No. 21877890.0-1205.
Korean Office Action dated Oct. 4, 2024, issued in Korean Application No. 10-2020-0129571.
European Office Action dated Oct. 2, 2025, issued in European Patent Application No. 21877890.0.

* cited by examiner

ANTENNA AND ELECTRONIC APPARATUS INCLUDING SAME

CROSS-REFERENCE TO RELATED APPLICATION(S)

This application is a continuation application, claiming priority under § 365(c), of an International application No. PCT/KR2021/013001, filed on Sep. 24, 2021, which is based on and claims the benefit of a Korean patent application number 10-2020-0129571, filed on Oct. 7, 2020, in the Korean Intellectual Property Office, the disclosure of which is incorporated by reference herein in its entirety.

BACKGROUND

1. Field

The disclosure relates to an antenna and an electronic device including the same.

2. Description of Related Art

The functional difference between electronic devices from respective manufacturers have decreased, electronic devices have thus become slimmer to incentivize consumers to buy them, and electronic devices have been developed to have increased rigidity, enhanced design aspects, and differentiated functional elements. In line with such trends, electronic devices have been developed such that improved radiation performance is exhibited by structurally changing at least one antenna which needs to be provided for communication, among components thereof.

The above information is presented as background information only to assist with an understanding of the disclosure. No determination has been made, and no assertion is made, as to whether any of the above might be applicable as prior art with regard to the disclosure.

SUMMARY

A mobile electronic device (or mobile terminal) may use antennas, and the volume and number of mounted antennas may be determined according to the service-specific frequency, bandwidth, and/or type. For example, a low band of about 700 megahertz (MHz)-900 MHz, a mid band of about 1700 MHz-2100 MHz, a high band of about 2300 MHz-2700 MHz, or a high-frequency band (e.g., fifth generation (5G) new radio (NR)) of about 3 gigahertz (GHz)-300 GHz may be used as a major communication band. As another example, various wireless communication services such as Bluetooth™ (BT), global positioning system (GPS), or wireless-fidelity (Wi-Fi) may be used. In order to support the above-mentioned communication bands, multiple antennas need to be included in electronic devices, but electronic devices which have become slimmer, or which have large-area displays, may have reduced spaces in which antennas can be disposed. In order to overcome this, service bands having similar frequency bands may be grouped such that multiple separated antennas are designed.

For example, antennas may operate in various frequency bands, such as second generation (2G) bands (e.g., global system for mobile communication (GSM) 850, extended global system for mobile communications (EGSM), distributed control system (DCS), personal communications services (PCS)), wideband code division multiple access (WCDMA) (e.g., B1, B2, B5, B8), long-term evolution (LTE) bands (e.g., B1, B2, B3, B4, B5, B7, B8, B12, B17, B18, B19, B20, B26, B38, B39, B40, B41), and/or Sub-6 bands (e.g., n77, n78, n79). When such antennas are implemented individually so as to operate in all frequency bands supported by electronic devices, it may be difficult to satisfy the business provider specification, to satisfy the specific absorption rate (SAR) standard, and/or to minimize influences on human bodies. Therefore, a single antenna may be implemented to operate in multiple frequency bands. For example, an antenna may include at least one matching circuit (e.g., matching time constant or lumped constant element) disposed on an electric path, thereby being configured to operate in multiple bands such as a low band and a mid band, a mid band and a high band, and/or a mid band, a high band, and a sub-6 band.

An electronic device may include a conductive lateral member (e.g., metal bezel or side bezel), and may include an antenna implemented by using at least one conductive portion formed through at least one non-conductive portion (e.g., segmented portion) formed on the conductive lateral member.

However, an antenna using such a conductive lateral member may have radiation performance degraded by a peripheral conductive structure (e.g., display) which is gradually expanded. In addition, the radiation performance may also be degraded by interference occurring when the user grips the electronic device.

Aspects of the disclosure are to address at least the above-mentioned problems and/or disadvantages and to provide at least the advantages described below. Accordingly, an aspect of the disclosure is to provide an antenna capable of improving radiation performance by using ground radiation through a peripheral conductive structure, and an electronic device including the same.

Another aspect of the disclosure is to provide an antenna configured to be able to reduce radiation performance degradation resulting from an approach of a dielectric material (e.g., gripping an electronic device), and an electronic device including the same.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a lateral member disposed on at least a part of the housing, the lateral member including a first side surface, a second side surface extending from an end of the first side surface perpendicularly, a third side surface extending from a different end of the first side surface in parallel with the second side surface, a first conductive portion disposed between a first non-conductive portion formed on the first side surface and a second non-conductive portion formed on the second side surface, a second conductive portion disposed between the first non-conductive portion and a third non-conductive portion formed on the third side surface, and a third conductive portion facing the first conductive portion with the second non-conductive portion interposed therebetween, on the second side surface, a substrate disposed in an inner space of the housing, and including a ground, a wireless communication circuit disposed on the substrate and electrically connected to a first point on the first conductive portion through a first electric path, a first switching circuit disposed on a second electric path electrically connecting the wireless communication circuit to a second point on the second conductive portion, a second switching circuit disposed on a third electric path connecting the first conductive portion and the third conductive portion, and at least one processor configured to control the first switching circuit and/or the second switching circuit, based on state information of the electronic device.

An antenna according to embodiments of the disclosure forms an antenna operating in a low band in a dual feeding type, through at least one conductive portion disposed on a conductive lateral member, thereby reducing radiation performance degradation caused by an approaching dielectric material (e.g., when an electronic device is gripped). In addition, radiation performance degradation in the low band may be reduced through an electric switching structure between conductive portions segmented through a non-conductive portion, and excellent radiation performance may be exhibited in a mid band and/or a high band.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
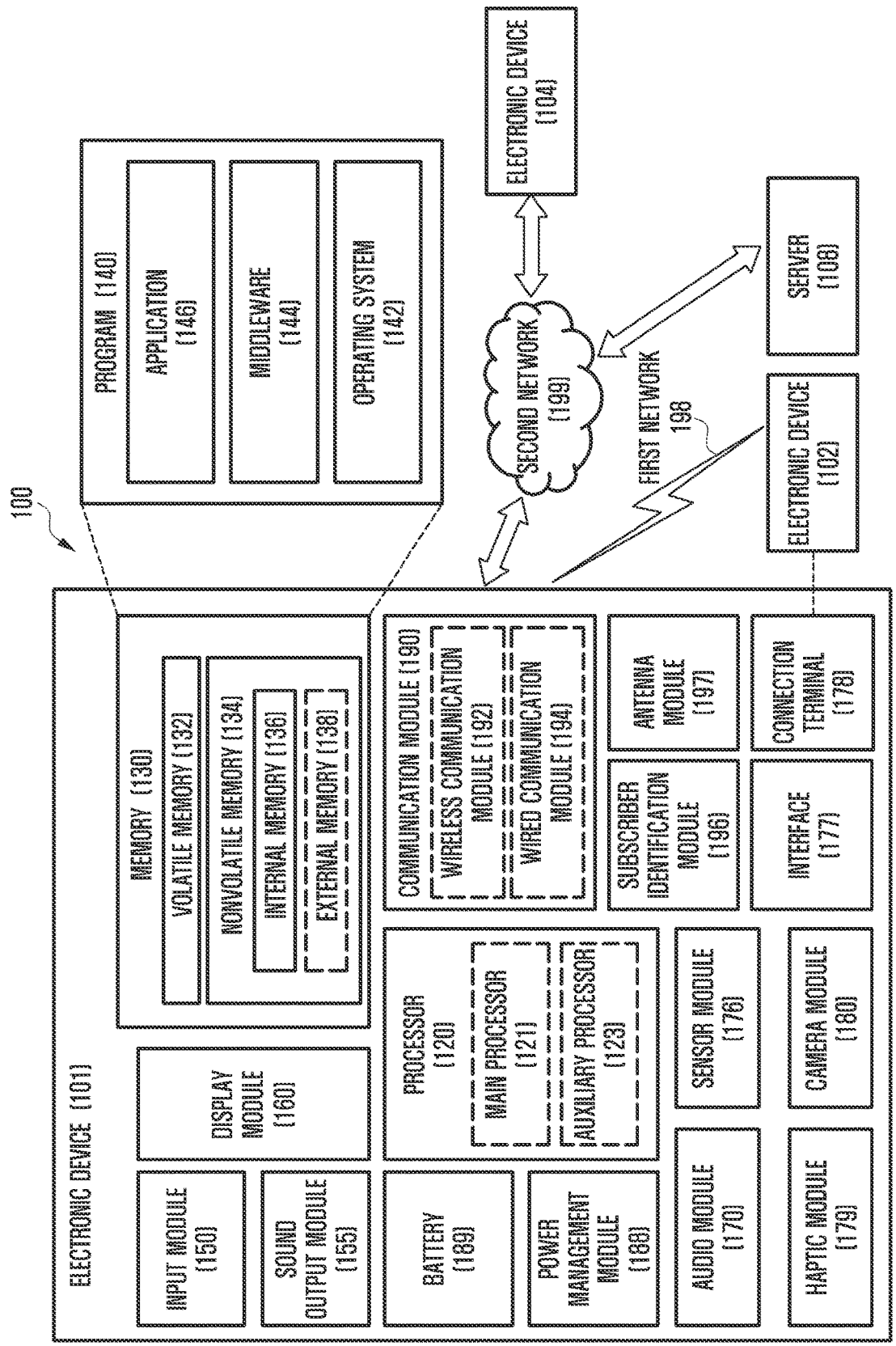
FIG. 1 is a block diagram of an electronic device in a network environment according to an embodiment of the disclosure.

FIG. 1 illustrates an example electronic device in a network environment according to an embodiment of the disclosure. Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input module 150, an audio output module 155, a display module 160, an audio module 170, a sensor module 176, an interface 177, a haptic module 179, a camera module 180, a power management module 188, a battery 189, a communication module 190, a subscriber identification module (SIM) 196, or an antenna module 197. In various embodiments, at least one (e.g., the display module 160 or the camera module 180) of the components may be omitted from the electronic device 101, or one or more other components may be added in the electronic device 101. In various embodiments, some of the components may be implemented as single integrated circuitry. For example, the sensor module 176 (e.g., a fingerprint sensor, an iris sensor, or an illuminance sensor) may be implemented as embedded in the display module 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory may include an internal memory 136 and/or an external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, or a digital pen (e.g., a stylus pen).

The audio output module 155 may output sound signals to the outside of the electronic device 101. The audio output module 155 may include, for example, a speaker or a receiver. The speaker may be used for general purposes, such as playing multimedia or playing record, and the receiver may be used for an incoming call. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the audio output module 155 or a headphone of an external electronic device (e.g., the electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture an image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form an mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102 and 104, or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
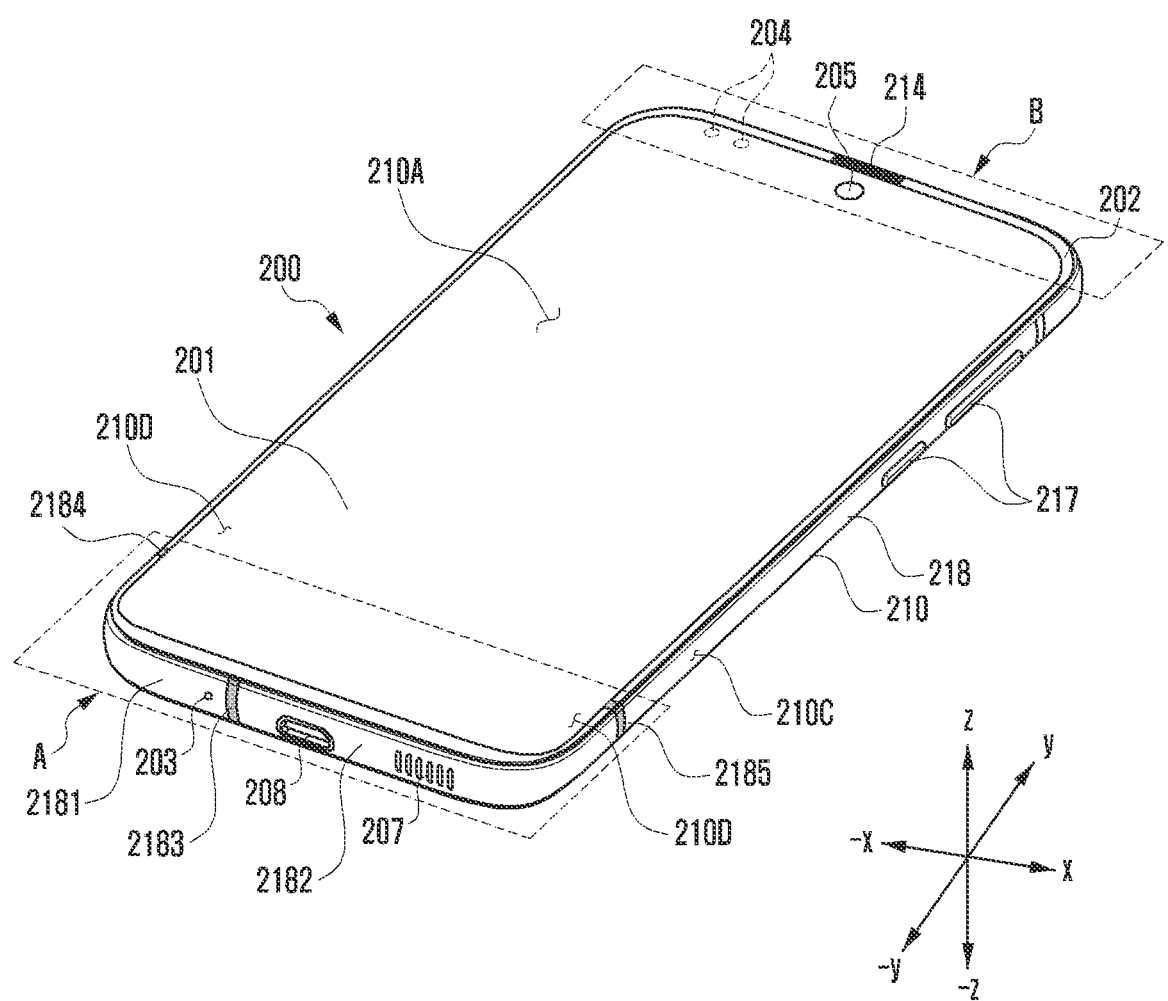
FIG. 2A is a perspective view of an electronic device according to an embodiment of the disclosure.
Figure 2B:
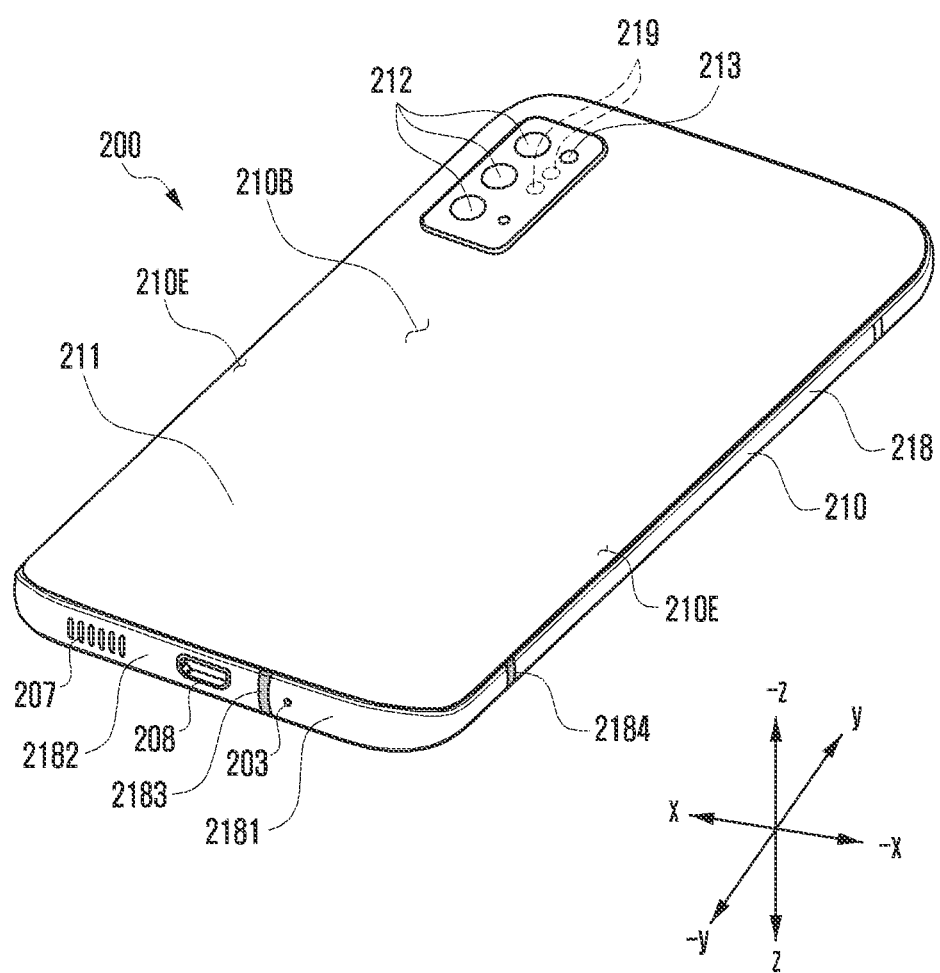
FIG. 2B is a rear perspective view of an electronic device according to an embodiment of the disclosure.

FIG. 2A illustrates a perspective view showing a front surface of a mobile electronic device according to an embodiment of the disclosure. FIG. 2B illustrates a perspective view showing a rear surface of the mobile electronic device shown in FIG. 2A according to an embodiment of the disclosure.

Mobile electronic device 200 in FIGS. 2A and 2B may be at least partially similar to the electronic device 101 in FIG. 1 or may further include other embodiments.

Referring to FIGS. 2A and 2B, a mobile electronic device 200 may include a housing 210 that includes a first surface (or front surface) 210A, a second surface (or rear surface) 210B, and a lateral surface 210C that surrounds a space between the first surface 210A and the second surface 210B. The housing 210 may refer to a structure that forms a part of the first surface 210A, the second surface 210B, and the lateral surface 210C. The first surface 210A may be formed of a front plate 202 (e.g., a glass plate or polymer plate coated with a variety of coating layers) at least a part of which is substantially transparent. The second surface 210B may be formed of a rear plate 211 which is substantially opaque. The rear plate 211 may be formed of, for example, coated or colored glass, ceramic, polymer, metal (e.g., aluminum, stainless steel (STS), or magnesium), or any combination thereof. The lateral surface 210C may be formed of a lateral bezel structure (or "lateral member") 218 which is combined with the front plate 202 and the rear plate 211 and includes a metal and/or polymer. The rear plate 211 and the lateral bezel structure 218 may be integrally formed and may be of the same material (e.g., a metallic material such as aluminum).

The front plate 202 may include two first regions 210D disposed at long edges thereof, respectively, and bent and extended seamlessly from the first surface 210A toward the rear plate 211. Similarly, the rear plate 211 may include two second regions 210E disposed at long edges thereof, respectively, and bent and extended seamlessly from the second surface 210B toward the front plate 202. The front plate 202 (or the rear plate 211) may include only one of the first regions 210D (or of the second regions 210E). The first regions 210D or the second regions 210E may be omitted in part. When viewed from a lateral side of the mobile electronic device 200, the lateral bezel structure 218 may have a first thickness (or width) on a lateral side where the first region 210D or the second region 210E is not included, and may have a second thickness, being less than the first thickness, on another lateral side where the first region 210D or the second region 210E is included.

The mobile electronic device 200 may include at least one of a display 201, audio modules 203, 207, and 214, sensor modules 204 and 219, camera modules 205, 212 and 213, a key input device 217, a light emitting device, and connector holes 208 and 209. The mobile electronic device 200 may omit at least one (e.g., the key input device 217 or the light emitting device) of the above components, or may further include other components.

The display 201 may be exposed through a substantial portion of the front plate 202, for example. At least a part of the display 201 may be exposed through the front plate 202 that forms the first surface 210A and the first region 210D of the lateral surface 210C. The display 201 may be combined with, or adjacent to, a touch sensing circuit, a pressure sensor capable of measuring the touch strength (pressure), and/or a digitizer for detecting a stylus pen. At least a part of the sensor modules 204 and 219 and/or at least a part of the key input device 217 may be disposed in the first region 210D and/or the second region 210E.

According to certain embodiments, the audio module 203 may include at least one microphone. In certain embodiments, the audio module 203 may include a plurality of microphones disposed to detect the direction of a sound. According to an embodiment, the sound output devices (e.g., audio modules 203, 207, 214) may include speakers. According to an embodiment, the audio module 203 may include a receiver for calls disposed in the first housing 210, and a speaker. In certain embodiments, the audio module 203, the sound output devices (e.g., audio modules 207 and 214), and the connector port (e.g., connector hole 208) may be disposed in a space arranged in the first housing 210 and/or the second housing 220 of the mobile electronic device 200, and may be exposed to the external environment through at least one hole formed in the first housing 210 and/or the second housing 220. In certain embodiments, the sound output devices (e.g., audio modules 203, 207, 214) may include a speaker (e.g., piezo speaker) that operates without using a hole formed in the first housing 210 and/or the second housing 220.

The sensor modules 204 and 219 may generate electrical signals or data corresponding to an internal operating state of the mobile electronic device 200 or to an external environmental condition. The sensor modules 204 and 219 may include a first sensor module 204 (e.g., a proximity sensor) and/or a second sensor module (e.g., a fingerprint sensor) disposed on the first surface 210A of the housing 210, and/or a third sensor module 219 (e.g., a heart rate monitor (HRM) sensor) and/or a fourth sensor module (e.g., a fingerprint sensor) disposed on the second surface 210B of the housing 210. The fingerprint sensor may be disposed on the second surface 210B as well as the first surface 210A (e.g., the display 201) of the housing 210. The mobile electronic device 200 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205, 212 and 213 may include a first camera device 205 disposed on the first surface 210A of the mobile electronic device 200, and a second camera device 212 and/or a flash 213 disposed on the second surface 210B. The camera module 205 or the camera module 212 may include one or more lenses, an image sensor, and/or an image signal processor. The flash 213 may include, for example, a light emitting diode or a xenon lamp. Two or more lenses (infrared cameras, wide angle and telephoto lenses) and image sensors may be disposed on one side of the mobile electronic device 200.

The key input device 217 may be disposed on the lateral surface 210C of the housing 210. The mobile electronic device 200 may not include some or all of the key input device 217 described above, and the key input device 217 which is not included may be implemented in another form such as a soft key on the display 201. The key input device 217 may include the sensor module disposed on the second surface 210B of the housing 210.

The light emitting device may be disposed on the first surface 210A of the housing 210. For example, the light emitting device may provide status information of the mobile electronic device 200 in an optical form. The light emitting device may provide a light source associated with the operation of the camera module 205. The light emitting device may include, for example, a light emitting diode (LED), an IR LED, or a xenon lamp.

The connector holes 208 and 209 may include a first connector hole 208 adapted for a connector (e.g., a USB connector) for transmitting and receiving power and/or data to and from an external electronic device, and/or a second connector hole 209 adapted for a connector (e.g., an earphone jack) for transmitting and receiving an audio signal to and from an external electronic device.

Some sensor modules of camera modules 205 and 212, some sensor modules of sensor modules 204 and 219, or an indicator may be arranged to be exposed through the display 201. For example, the camera module 205, the sensor module 204, or the indicator may be arranged in the internal space of an electronic device (e.g., mobile electronic device 200) so as to be brought into contact with an external environment through an opening of the display 201, which is perforated up to the front plate 202. According to an embodiment, an area corresponding to some camera module 105 of the display 201 is a part of an area in which content is displayed, and may be formed as a transmission area having designated transmittance. For example, the transmission area may be formed to have transmittance having a range of about 5% to about 20%. For example, a transmission area of the display 201 may include an area in which the density of pixels and/or a wiring density are lower than that of surroundings. The camera module 205 may include, for example, under display camera (UDC). In another embodiment, some sensor modules 204 may be arranged to perform their functions without being visually exposed through the front plate 202 in the internal space of the electronic device. For example, in this case, an area of the display 201 facing the sensor module may not require a perforated opening.

According to various embodiments, the mobile electronic device 200 may include an antenna formed through at least a part of a conductive member included in the lateral member 218. For example, the antenna may be formed by electrically connecting at least one conductive portion 2181, 2182 segmented through at least one non-conductive portion 2183, 2184, 2185 disposed on the lateral member 218 to a wireless communication circuit (e.g., wireless communication module 192 in FIG. 1). An antenna according to an embodiment of the disclosure may reduce radiation performance degradation in a low band by being disposed on the lateral member 218, by feeding each of a first conductive portion 2181 and a second conductive portion 2182 segmented by non-conductive portion 2183, and by using ground radiation through a peripheral conductive structure (e.g., a display).

Figure 3:
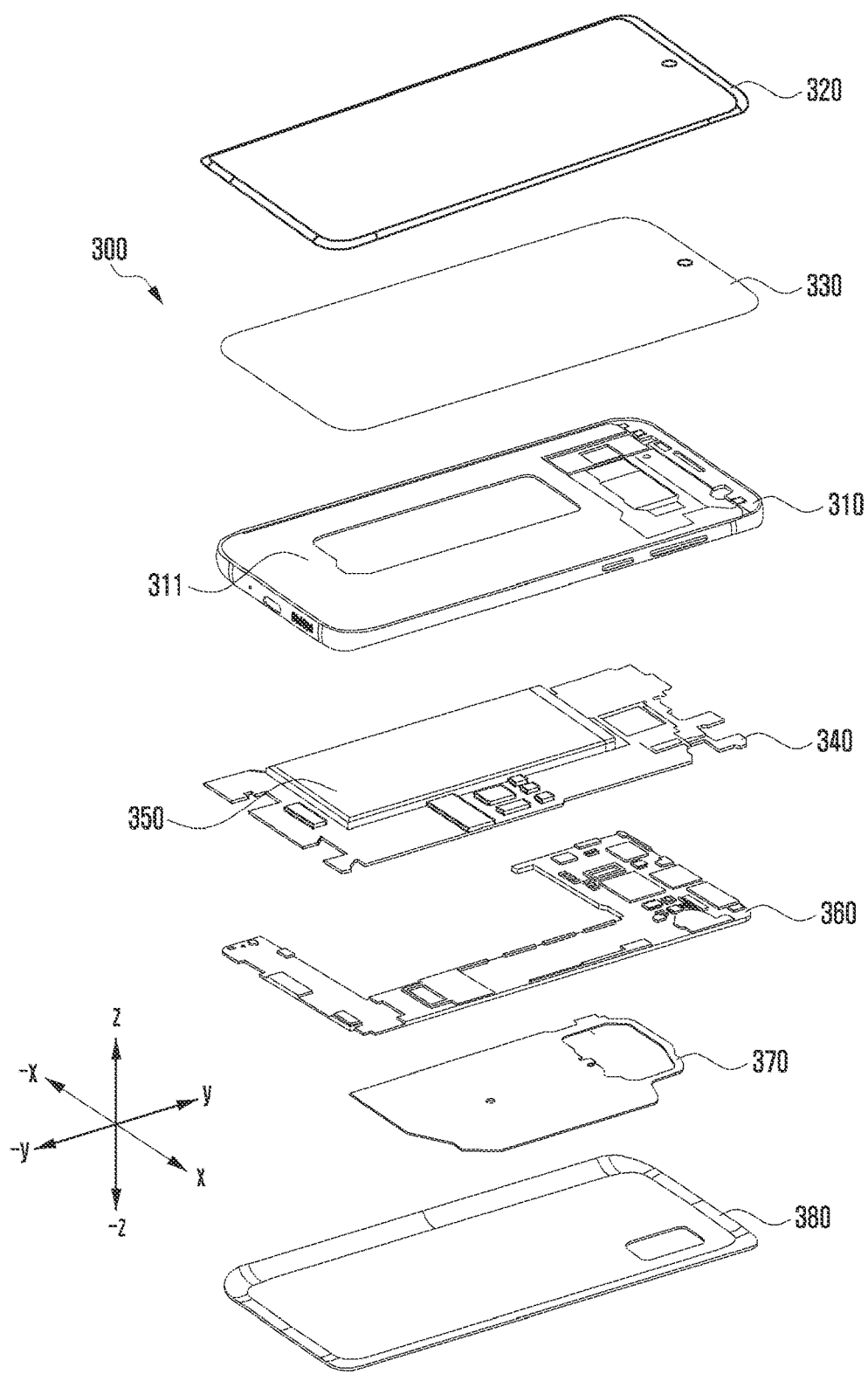
FIG. 3 is an exploded perspective view of an electronic device according to an embodiment of the disclosure.

FIG. 3 illustrates an exploded perspective view showing a mobile electronic device shown in FIG. 1 according to an embodiment of the disclosure.

Mobile electronic device 300 in FIG. 3 may be at least partially similar to the mobile electronic device 200 in FIGS. 2A and 2B or may further include other embodiments.

Referring to FIG. 3, a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the mobile electronic device 300 may be the same as or similar to those of the mobile electronic device 200 shown in FIG. 2A or 2B, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
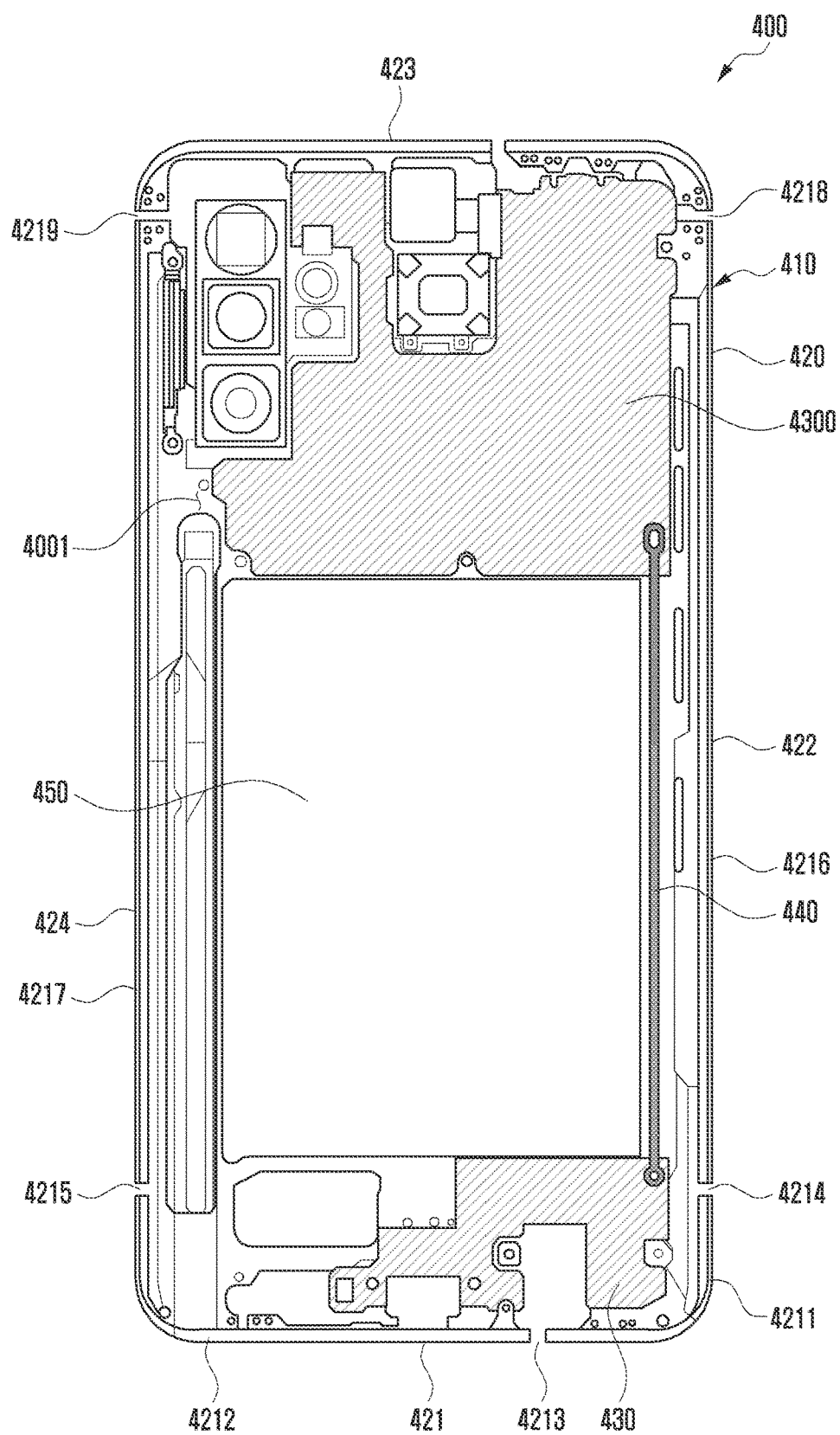
FIG. 4 illustrates the configuration of an electronic device including an antenna according to an embodiment of the disclosure.

FIG. 4 illustrates the configuration of an electronic device including an antenna according to an embodiment of the disclosure.

Electronic device 400 in FIG. 4 may be at least partially similar to the electronic device 101 in FIG. 1, the mobile electronic device 200 in FIG. 2A, or the mobile electronic device 300 in FIG. 3, or may further include other embodiments of an electronic device.

FIG. 4 is a configuration diagram when the rear surface (e.g., second surface 210B in FIG. 2B) of electronic device 400 is seen, with the rear cover (e.g., rear plate 211 in FIG. 2B) removed.

Referring to FIG. 4, an electronic device 400 may include a housing 410 (e.g., lateral member 218 in FIG. 2A) including a front cover (e.g., front plate 202 in FIG. 2A), a rear cover (e.g., rear plate 211 in FIG. 2B) facing in the opposite direction to the front cover, and a lateral member 420 (e.g., lateral member 218 in FIG. 2A) surrounding an inner space 4001 between the front cover and the rear cover. According to an embodiment, the lateral member 420 may be at least partially made of a conductive material (e.g., metal).

According to various embodiments, the lateral member 420 may include a first side surface 421 having a first length, a second side surface 422 extending from the first side surface 421 perpendicularly and having a second length larger than the first length, a third side surface 423 extending from the second side surface 422 in parallel with the first side surface 421 and having the first length, and a fourth side surface 424 extending from the third side surface 423 in parallel with the second side surface 422 and having the second length.

According to various embodiments, the electronic device 400 may include a substrate 430 (e.g., first substrate or printed circuit board) disposed in the inner space 4001, and a sub-substrate 4300 (e.g., second substrate or printed circuit board) disposed to be spaced apart from the substrate 430. According to an embodiment, the substrate 430 may have at least one wireless communication circuit (e.g., wireless communication module 192 in FIG. 1) disposed thereon. According to an embodiment, the electronic device 400 may include a battery 450 disposed between the substrate 430 and the sub-substrate 4300. According to an embodiment, the battery 450 may be disposed so as not to overlap the substrate 430 and/or the sub-substrate 4300. In another embodiment, the battery 450 may be disposed so as to at least partially overlap the substrate 430 and/or the sub-substrate 4300. According to an embodiment, the substrate 430 may be electrically connected to the sub-substrate 4300 through an electric connection member 440. According to an embodiment, the electric connection member 440 may include an RF coaxial cable or a flexible printed circuit (FPCB) type RF cable (FRC). In some embodiments, the wireless communication circuit (e.g., wireless communication module 192 in FIG. 1) may be disposed on the sub-substrate 4300 and may be electrically connected to the substrate 430 through the electric connection member 440. As another example, the wireless communication circuit (e.g., wireless communication module 192 in FIG. 1) may be disposed on the sub-substrate 4300.

According to various embodiments, the lateral member 420 including a conductive material may include at least one conductive portion 4211, 4212, 4216, 4217 segmented through at least one non-conductive portion 4213, 4214, 4215, 4218, 4219. According to an embodiment, the electronic device 400 may include four conductive portions 4211, 4212, 4216, 4217 disposed through five non-conductive portions 4213, 4214, 4215, 4218, 4219 which are spaced apart. For example, the electronic device 400 may include a first non-conductive portion 4213 formed on at least a part of the first side surface 421, a second non-conductive portion 4214 formed on at least a part of the second side surface 422, and a first conductive portion 4211 positioned between the first non-conductive portion 4213 and the second non-conductive portion 4214. According to an embodiment, the electronic device 400 may include the first non-conductive portion 4213 formed on at least a part of the first side surface 421, a third non-conductive portion 4215 formed on at least a part of the fourth side surface 424, and a second conductive portion 4212 positioned between the first non-conductive portion 4213 and the third non-conductive portion 4215. According to an embodiment, the electronic device 400 may include the second non-conductive portion 4214 formed on at least a part of the second side surface 422, a fourth non-conductive portion 4218, and a third conductive portion 4216 positioned between the second non-conductive portion 4214 and the fourth non-conductive portion 4218. According to an embodiment, the electronic device 400 may include the third non-conductive portion 4215 formed on at least a part of the fourth side surface 424, a fifth non-conductive portion 4219, and a fourth conductive portion 4217 positioned between the third non-conductive portion 4215 and the fifth non-conductive portion 4219. According to an embodiment, the second non-conductive portion 4214 and the third non-conductive portion 4215 may be disposed in substantially left/right symmetric positions with reference to the first side surface 421. In some embodiment, the second non-conductive portion 4214 and the third non-conductive portion 4215 may be disposed in substantially left/right asymmetric positions with reference to the first side surface 421.

According to various embodiments, the electronic device 400 may include an antenna operating in a low band through a dual feeding structure in which the first conductive portion 4211 and the second conductive portion 4212 are simultaneously fed through the wireless communication circuit (e.g., wireless communication module 192 in FIG. 1). In this case, the antenna may resonate by using ground radiation through a conductive structure (e.g., metal sheet layer) of a display (e.g., display 201 in FIG. 2A) in the longitudinal direction (e.g., from the first side surface 421 toward the third side surface 413) of the electronic device 400, thereby helping reduce radiation performance degradation when the electronic device 400 is gripped.

Figure 5A:
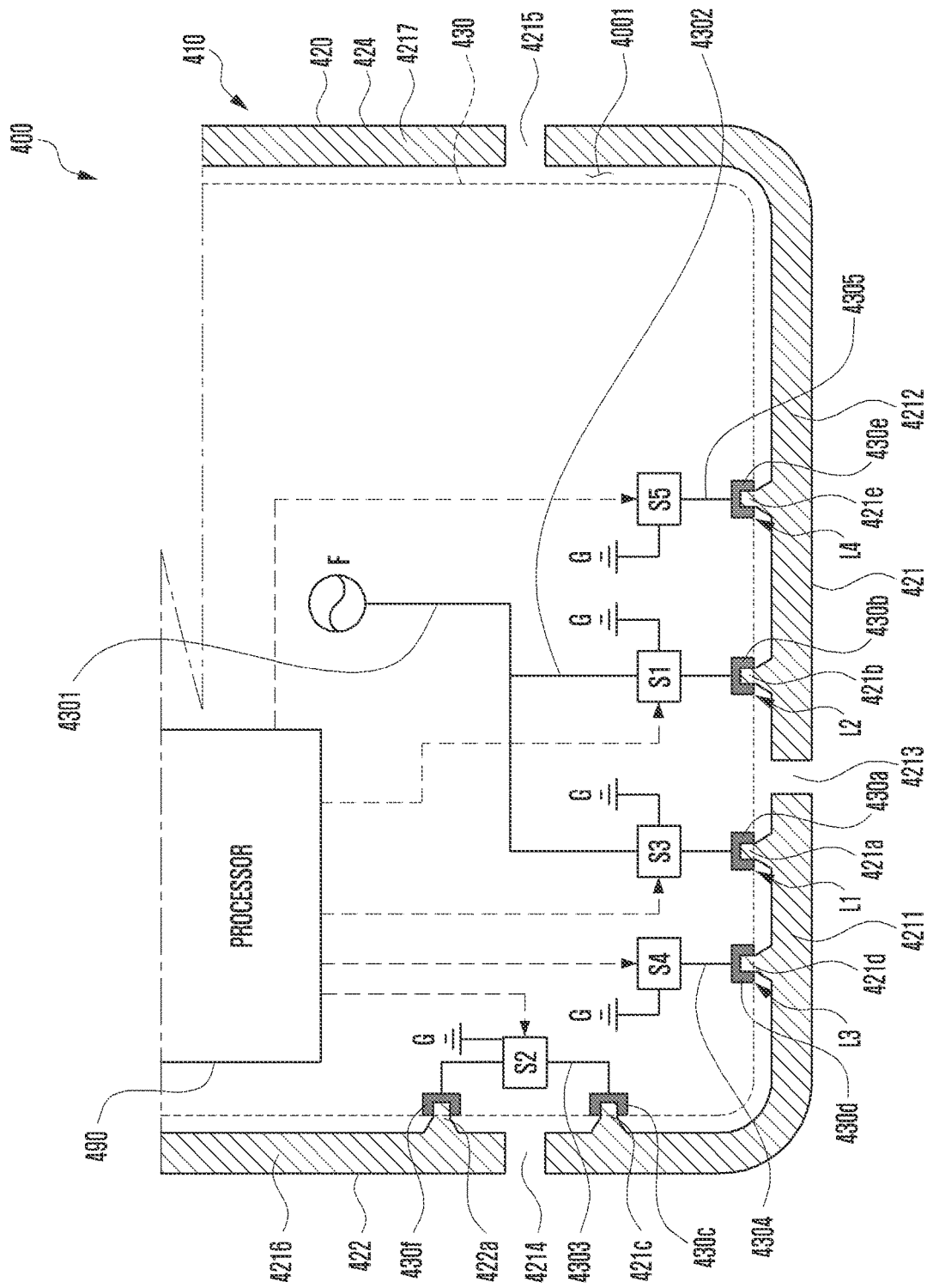
FIGS. 5A and 5B illustrate antenna disposition structures according to various embodiments of the disclosure.
Figure 5B:
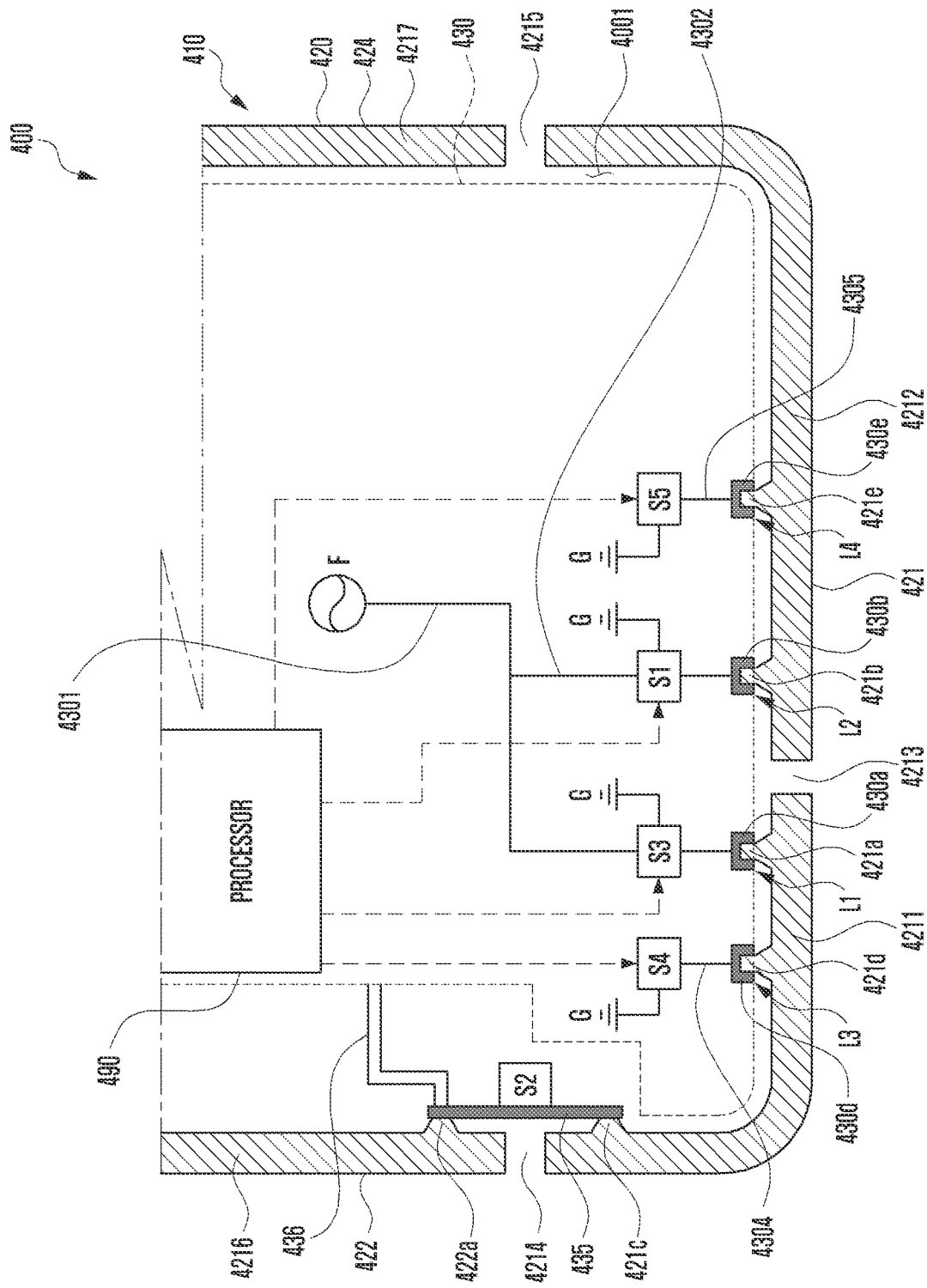

FIGS. 5A and 5B illustrate antenna disposition structures according to various embodiments of the disclosure.

Referring to FIG. 5A, the electronic device 400 may include the lateral member 420 including conductive portions 4211, 4212 disposed to be segmented through non-conductive portions 4213, 4214, 4215 which are spaced apart. According to an embodiment, the non-conductive portions 4213, 4214, 4215 may include the first non-conductive portion 4213 formed on at least a part of the first side surface 421, the second non-conductive portion 4214 formed on at least a part of the second side surface, and the third non-conductive portion 4215 formed on at least a part of the fourth side surface 424. According to an embodiment, the conductive portions 4211, 4212 may include the first conductive portion 4211 segmented through the first non-conductive portion 4213 and the second non-conductive portion 4214, and the second conductive portion 4212 segmented through the first non-conductive portion 4213 and the third non-conductive portion 4215. According to an embodiment, the lateral member 420 may include the third conductive portion 4216 disposed on the second side surface 422 and segmented from the first conductive portion 4211 with reference to the second non-conductive portion 4214, and the fourth conductive portion 4217 disposed on the fourth side surface 424 and segmented from the second conductive portion 4212 with reference to the third non-conductive portion 4215. According to an embodiment, the second non-conductive portion 4214 and the third non-conductive portion 4215 may be disposed on the second side surface 422 and the fourth side surface 424 in substantially left/right symmetric positions with reference to the first side surface 421, respectively.

According to various embodiments, the lateral member 420 may include a first connection piece 421a extending into the inner space 4001 from a first point L1 on the first conductive portion 4211 spaced apart from the first non-conductive portion 4213 by a designated distance. According to an embodiment, the lateral member 420 may include a second connection piece 421b extending into the inner space 4001 from a second point L2 on the second conductive portion 4212 spaced apart from the first non-conductive portion 4213 by a designated distance. According to an embodiment, the lateral member 420 may include a third connection piece 421c extending into the inner space 4001 from the first conductive portion 4211 in the vicinity of the second non-conductive portion 4214, and a fourth connection piece 422a extending into the inner space 4001 from the third conductive portion 4216 in the vicinity of the second non-conductive portion 4214. According to an embodiment, the lateral member 420 may include a fifth connection piece 421d extending into the inner space 4001 from a third point L3 on the first conductive portion 4211, which is farther from the first non-conductive portion 4213 than the first point L1. According to an embodiment, the lateral member 420 may include a sixth connection piece 421e extending into the inner space 4001 from a fourth point L4 on the second conductive portion 4212, which is farther from the first non-conductive portion 4213 than the second point L2.

According to various embodiments, the electronic device 400 may include the substrate 430. According to an embodiment, the substrate 430 may include a first connection portion 430a electrically connected to the first connection piece 421a, a second connection portion 430b electrically connected to the second connection piece 421b, a third connection portion 430c electrically connected to the third connection piece 421c, a fourth connection portion 430f electrically connected to the fourth connection piece 422a, a fifth connection portion 430d electrically connected to the fifth connection piece 421d, and/or a sixth connection portion 430e electrically connected to the sixth connection piece 421e. According to an embodiment, the connection pieces 421a, 421b, 421c, 421f, 421d, 421e may be physically/electrically connected to the connection portions 430a, 430b, 430c, 430f, 430d, 430e solely by structural coupling by which the substrate 430 is disposed in the inner space 4001 of the electronic device 400. In some embodiments, the connection pieces 421a, 421b, 421c, 421f, 421d, 421e may be electrically connected to the connection portions 430a, 430b, 430c, 430f, 430d, 430e through an electric connection member such as a C-clip or conductive tape.

According to various embodiments, the first connection portion 430a may be electrically connected to a wireless communication circuit F (e.g., wireless communication module 192 in FIG. 1) through a first electric path 4301 (e.g., wiring line) formed on the substrate 430. According to an embodiment, the second connection portion 430b may be electrically connected to the wireless communication circuit F through a second electric path 4302 which is formed on the substrate 430, and which branches off from the first electric path 4301. According to an embodiment, the third connection portion 430c and the fourth connection portion 430f may be electrically connected to the ground G of the substrate 430 through a third electric path 4303 formed on the substrate 430. According to an embodiment, the fifth connection portion 430d may be electrically connected to the ground G of the substrate 430 through a fourth electric path 4304 formed on the substrate 430. According to an embodiment, the sixth connection portion 430e may be electrically connected to the ground G of the substrate 430 through a fifth electric path 4305 formed on the substrate 430.

According to various embodiments, the electronic device 400 may include a first switching circuit S1 disposed on the second electric path 4302, a second switching circuit S2 disposed on the third electric path 4303, a third switching circuit S3 disposed on the first electric path 4301 between the first connection portion 430a and the portion from which the second electric path 4302 branches off, a fourth switching circuit S4 disposed on the fourth electric path 4304, and/or a fifth switching circuit S5 disposed on the fifth electric path 4305. According to an embodiment, the switching circuits S1, S2, S3, S4, S5 (e.g., tunable ICs) may include multiple elements (e.g., multiple passive elements 520 in FIG. 5C) and a switch (e.g., switch 510 in FIG. 5C) for electrically connecting at least one of the multiple elements or for opening a corresponding electric path. According to an embodiment, the multiple elements may include a capacitor and/or an inductor having different element values.

According to various embodiments, the first switching circuit S1 may perform a switching function of electrically connecting the wireless communication circuit F and the second conductive portion 4212 such that the second conductive portion 4212 operates in a low band, or connecting the second conductive portion 4212 to the ground G such that, through single feeding, the first conductive portion 4211 operates in a low band, a mid band, and/or a high band. According to an embodiment, the second switching circuit S2 may open the third electric path 4303 such that, when the first conductive portion 4211 or the second conductive portion 4212 operates in a low band, the first conductive portion 4211 and the third conductive portion 4216 are capacitively coupled. According to an embodiment, the second switching circuit S2 may include at least one capacitor having a designated capacitance value and thus may be used for mid band and/or high band frequency matching. In an embodiment, the second switching circuit S2 may cause ground radiation to be used such that, in a low band, the first conductive portion 4211 and the third conductive portion 4216 appear electrically disconnected, and may electrically connect the first conductive portion 4211 and the third conductive portion 4216 in a mid band and/or a high band, thereby reducing radiation degradation due to gripping. According to an embodiment, the third switching circuit S3 may be used to improve antenna input impedance matching. According to an embodiment, the third switching circuit S3 may include a tunable IC such that one of multiple passive elements (e.g., capacitor and/or inductor) can be selectively used. According to an embodiment, the fourth switching circuit S4 and the fifth switching circuit S5 may play the role of making compensation such that, during dual feeding, the first conductive portion 4211 and the second conductive portion 4212 have substantially the same electric length, and may include multiple passive elements (e.g., capacitor and/or inductor).

In some embodiment, the second connection portion 430b may be electrically connected to the wireless communication circuit F through a second electrically path disposed on the substrate 430 separately from the first electric path 4301, without branching off from the first electric path 4301. In some embodiment, the fourth switching circuit S4, the fifth switching circuit S5, or the electric paths 4304, 4305 may be omitted. In this case, the segmentation position of the first non-conductive portion 4213 may be determined such that the electric length from the first connection portion 430a to the second non-conductive portion 4214 is substantially identical to the electric length from the second connection portion 430b to the third non-conductive portion 4215. In some embodiments, a processor 490 of the electronic device 400 may control the switching circuits S1, S2, S3, S4, S5, based on state information of the electronic device 400, such that dual feeding of the first conductive portion 4211 and the second conductive portion 4212 is used to operate the same only in a low band, or the first conductive portion 4211 is used to operate the same only in a mid band and/or a high band, or operate in a low band, a mid band, and/or a high band.

Referring to FIG. 5B, the first conductive portion 4211 and the third conductive portion 4216 may be electrically connected through another substrate 435 disposed to be spaced apart from the substrate 430. According to an embodiment, the second switching circuit S2 may be disposed on the other substrate 435, and the other substrate 435 and the substrate 430 may be electrically connected through a connecting member 436 such as a flexible substrate (e.g., flexible printed circuit board (FPCB)). In this case, expansion of the substrate 430 for connecting the first conductive portion 4211 and the third conductive portion 4216 is avoided, and this may be advantageous to securing a space to mount peripheral electric structures. For example, the other substrate 435 may include an FPCB.

Figure 5C:
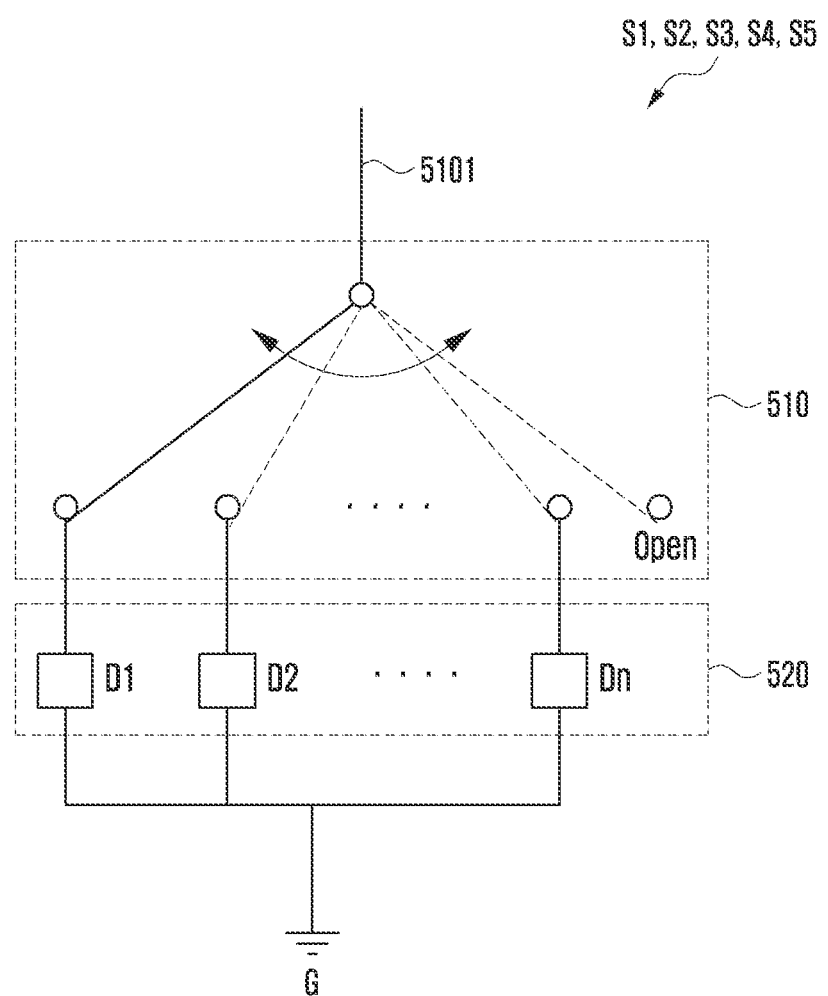
FIG. 5C illustrates the configuration of a switching circuit according to an embodiment of the disclosure.

FIG. 5C illustrates the configuration of a switching circuit according to an embodiment of the disclosure.

Referring to FIG. 5C, at least one of the switching circuits S1, S2, S3, S4, S5 may include at least one switch 510, or multiple passive elements 520 including D1, D2 . . . Dn, having different element values so as to be electrically connected to corresponding electric paths by the at least one switch 510, or to disconnect electric paths. According to an embodiment, the multiple passive elements 520 may include capacitors having various capacitance values and/or inductors having various inductance values. According to an embodiment, the at least one switch 510 may make connection to an electric path 5101 (e.g., electric paths 4301, 4302, 4303, 4304, 4305 in FIG. 5A) through an element having a designated element value under the control of a processor (e.g., processor 490 in FIG. 5A). In some embodiment, the switching circuits S1, S2, S3, S4, S5 may disconnect the corresponding electric path 5101 through the switch 510. According to an embodiment, the at least one switch 510 may include a micro-electro mechanical systems (MEMS) switch. According to an embodiment, the MEMS switch performs a mechanical switching operation via an inner metal plate and thus has complete turn on/off characteristics, and thus may not substantially affect antenna radiation characteristic changes. In some embodiments, the at least one switch 510 may include a single pole single throw (SPST) switch, a single pole double throw (SPDT) switch, or a switch including three or more throws.

Figure 6A:
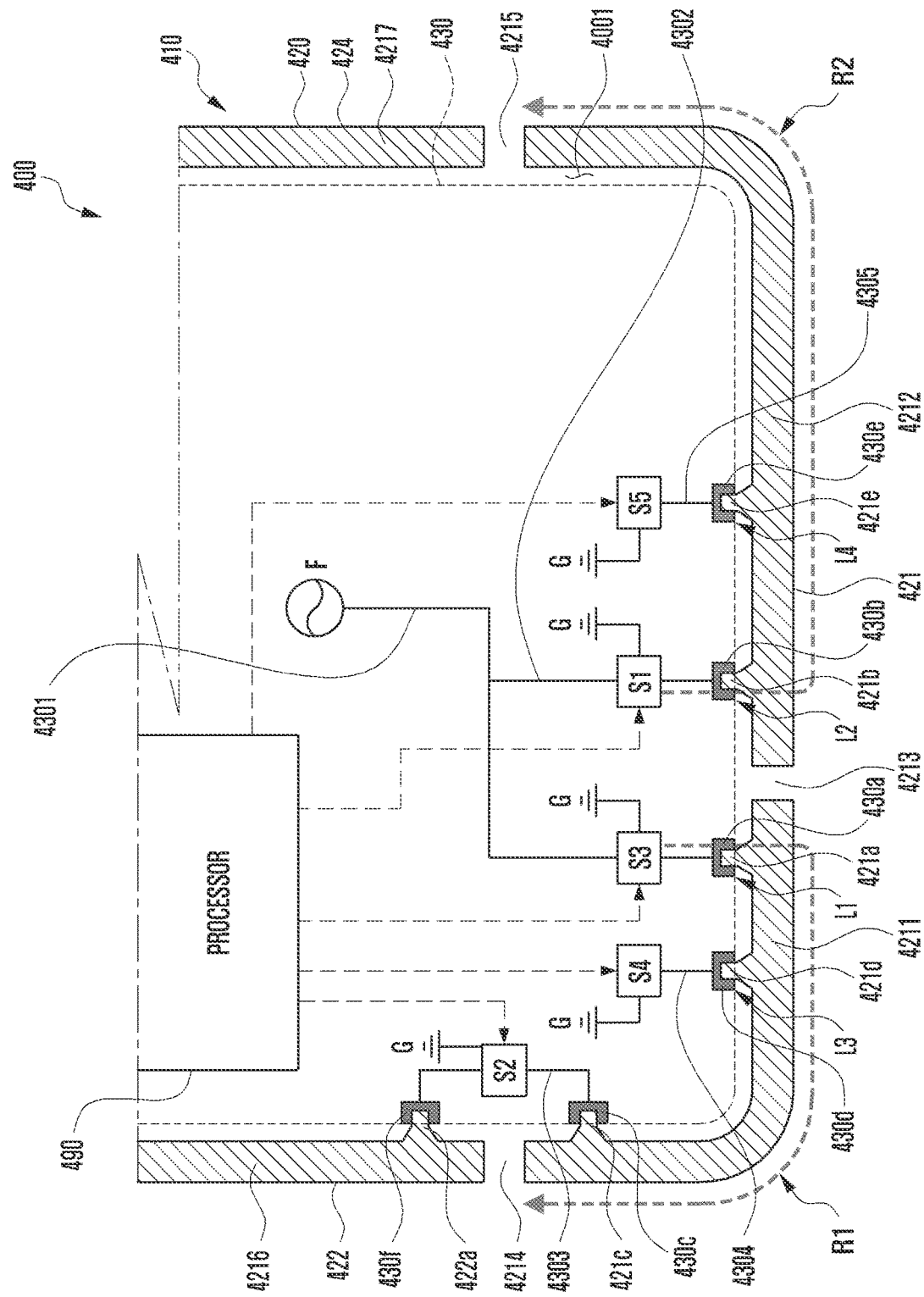
FIG. 6A illustrates an antenna radiation flow in a low band according to an embodiment of the disclosure.

FIG. 6A illustrates an antenna radiation flow in a low band according to an embodiment of the disclosure.

Referring to FIG. 6A, the wireless communication circuit F may be configured to transmit and/or receive radio signals in a low band through dual feeding by electrically connecting (feeding) to both the first conductive portion 4211 and the second conductive portion 4212. In this case, the first conductive portion 4211 and the third conductive portion 4216 may be electrically disconnected through the second switching circuit S2. In some embodiments, when the first conductive portion 4211 operates in multiple bands including a mid band and/or a high band, the first conductive portion 4211 and the third conductive portion 4216 may be electrically connected through the second switching circuit S2. For example, in a low band, the first conductive portion 4211 and the third conductive portion 4216 may be electrically connected through the second switching circuit S2 such that, during gripping, antenna radiation performance degradation is reduced even if the second non-conductive portion 4214 is covered. As another example, in a mid band and/or a high band, the first conductive portion 4211 and the third conductive portion 4216 may be electrically connected such that, during gripping, antenna radiation performance degradation is reduced even if the second non-conductive portion 4214 is covered.

According to various embodiments, the first conductive portion 4211 electrically connected to the wireless communication circuit F may have a first electric length R1 up to the second non-conductive portion 4214. According to an embodiment, the second conductive portion 4212 may have a second electric length R2 up to the third non-conductive portion 4215. According to an embodiment, the first non-conductive portion 4213 may not be disposed at the center of the first side surface 421 due to an electronic component (e.g., interface (IF) connector port) disposed in the inner space 4001 of the electronic device 400. In this case, the second electric length R2 of the second conductive portion 4212 may be compensated for through control of the fifth switching circuit S5 so as to be substantially identical to the first electric length R1 of the first conductive portion 4211. In some embodiments, the first electric length R1 of the first conductive portion 4211 may also be compensated for through control of the fourth switching circuit S4. In some embodiments, without compensation for the switching circuits S4, S5, the first conductive portion 4211 may be disposed in a position (e.g., at the center portion of the first side surface 421) such that the first electric length R1 and the second electric length R2 are substantially identical.

Figure 6B:
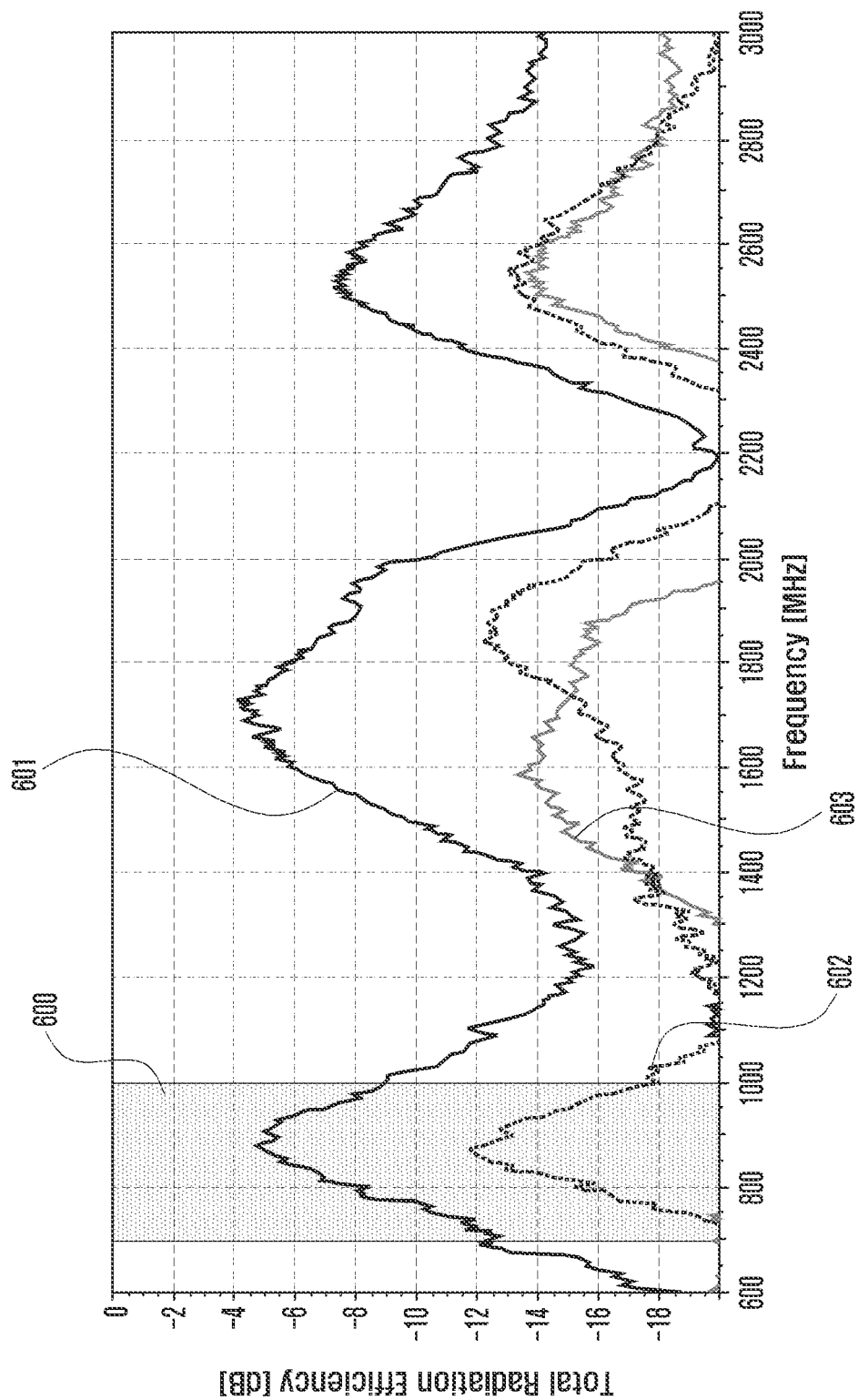
FIGS. 6B and 6C are graphs showing a comparison of antenna radiation performance in a low band, when an electronic device is gripped, between when a non-conductive portion is disposed on one side and when non-conductive portions are symmetrically disposed on left and right sides, according to various embodiments of the disclosure.
Figure 6C:
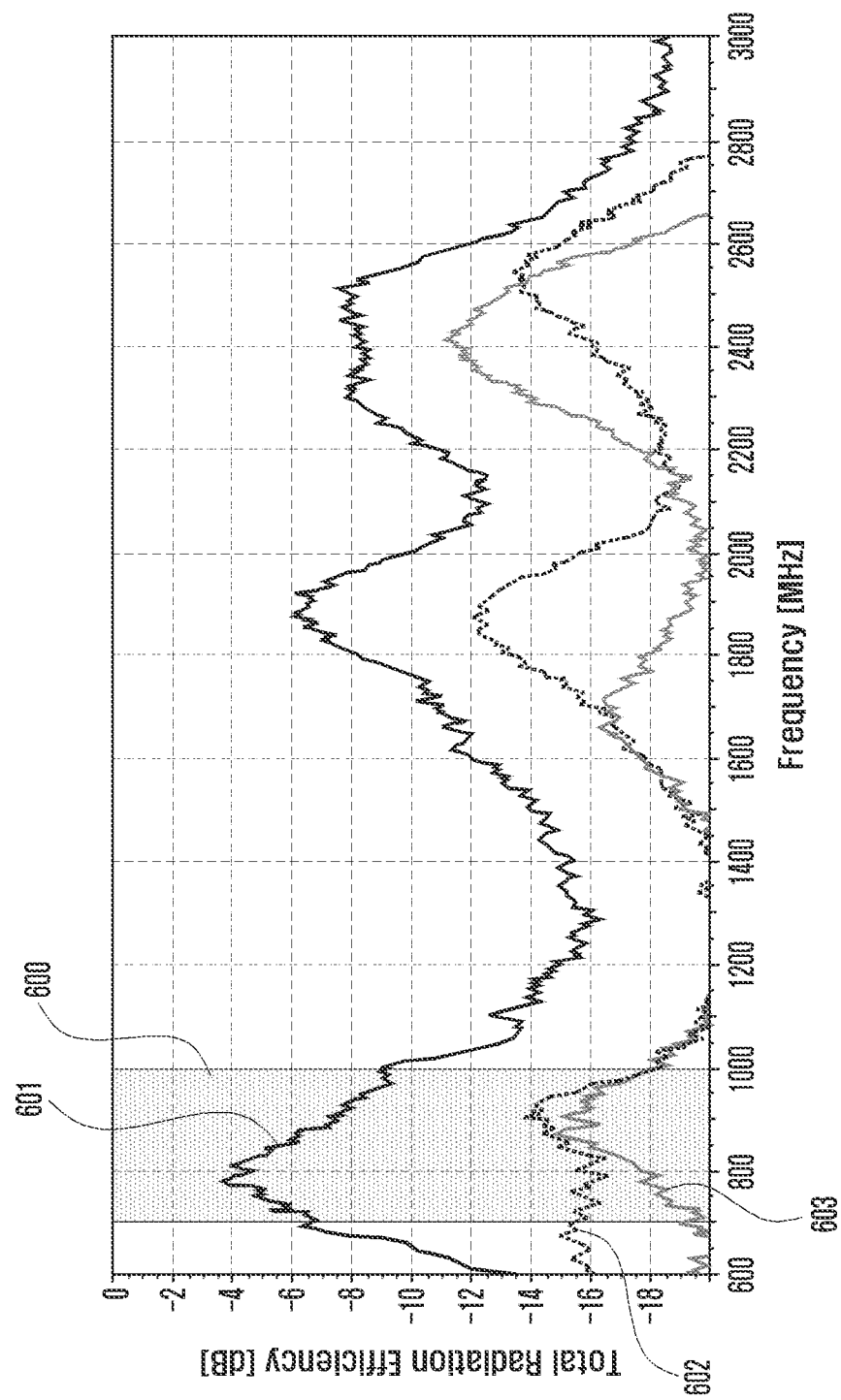

FIGS. 6B and 6C are graphs showing a comparison of antenna radiation performance in a low band, when an electronic device is gripped, between when a non-conductive portion is disposed on one side and when non-conductive portions are symmetrically disposed on left and right sides, according to various embodiments of the disclosure.

FIG. 6B is a graph illustrating antenna radiation performance when only the first conductive portion 4211 is fed. FIG. 6C is a graph showing a comparison of antenna radiation performance when the first conductive portion 4211 in FIG. 6A and the second conductive portion 4212 are dual-fed. Reference numeral 601 indicates antenna radiation performance in a free state without gripping, reference numeral 602 indicates antenna radiation performance when the right side, for example, the third non-conductive portion 4215 is gripped, and reference numeral 603 indicates antenna radiation performance when the left side, for example, the second non-conductive portion 4214 is gripped.

Referring to FIG. 6B, it is clear that, when the left/right side is gripped, and when single feeding is used (in the case of FIG. 6B), the radiation efficiency drops to −20 dB or lower (FIG. 6B) when one side (left side) is gripped in a low band (e.g., area 600). In the case of dual feeding using the first conductive portion 4211 and the second conductive portion 4212 (in the case of FIG. 6C), the resonance and antenna radiation efficiency are maintained at −16 dB or higher in a low band (e.g., area 600). This may mean that the antenna using the first conductive portion 4211 and the second conductive portion 4212 and operating through dual feeding has reduced radiation performance degradation in a low band during gripping.

Figure 7A:
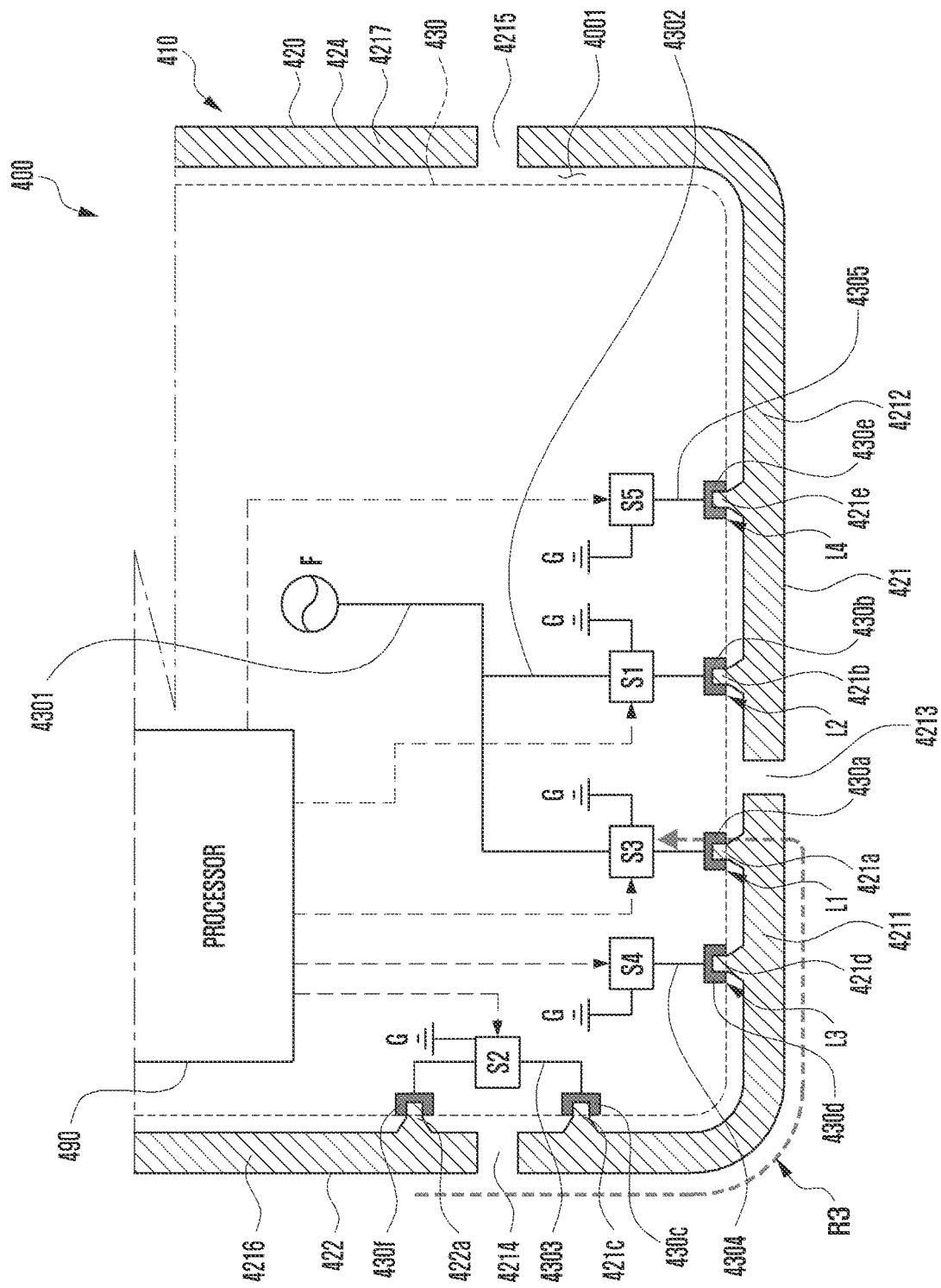
FIG. 7A illustrates an antenna radiation flow in a mid band according to an embodiment of the disclosure.

FIG. 7A illustrates an antenna radiation flow in a mid band according to an embodiment of the disclosure.

Referring to FIG. 7A, the wireless communication circuit F may be configured to transmit and/or receive radio signals in a mid band through the first conductive portion 4211 electrically connected through the first electric path 4301. According to an embodiment, the second conductive portion 4212 may be electrically connected to the ground G of the substrate 430 through the first switching circuit S1. According to an embodiment, electric length R3 of the first conductive portion 4211 may be adjusted through the fourth switching circuit S4. According to an embodiment, the first conductive portion 4211 and the third conductive portion 4216 may control the state of electric connection between the first conductive portion 4211 and the third conductive portion 4216 through the second switching circuit S2, thereby reducing radiation performance degradation during gripping. For example, when the first conductive portion 4211 operates in a mid band by using the fourth switching circuit S4, the second switching circuit S2 may be controlled such that the first conductive portion 4211 and the third conductive portion 4216 are electrically connected, if the second non-conductive portion 4214 is gripped.

Figure 7B:
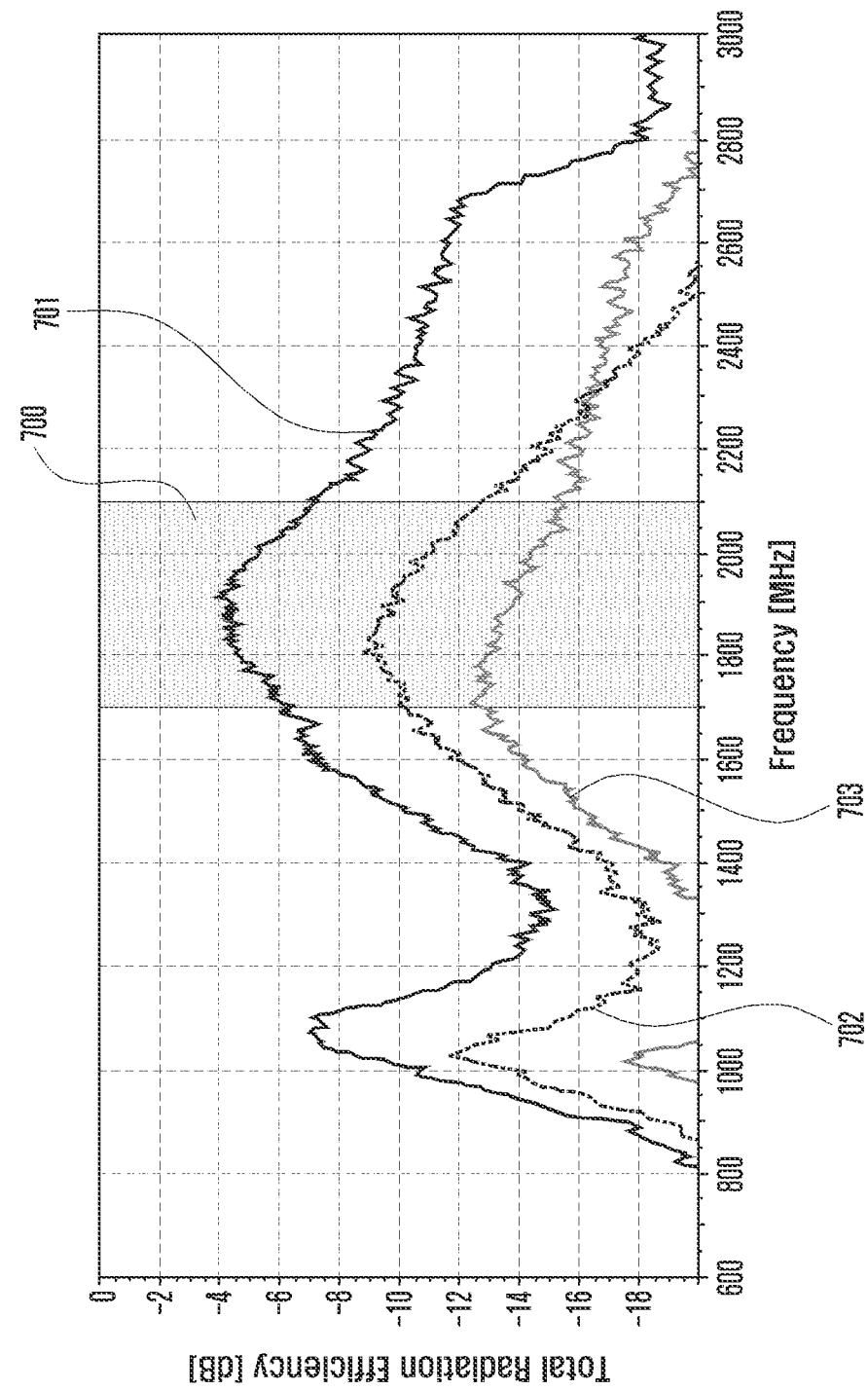
FIG. 7B is a graph showing antenna radiation performance in a mid band, when an electronic device is gripped, according to an embodiment of the disclosure.

FIG. 7B is a graph illustrating antenna radiation performance in a mid band, when the electronic device is gripped, according to an embodiment of the disclosure. Reference numeral 701 indicates antenna radiation performance in a free state without gripping, reference numeral 702 indicates antenna radiation performance when the right side, for example, the third non-conductive portion 4215 is gripped, and reference numeral 703 indicates antenna radiation performance when the left side, for example, the second non-conductive portion 4214 is gripped.

As illustrated, it is clear that, when the first conductive portion 4211 and the third conductive portion 4216 are electrically connected through the second switching circuit S2, the antenna resonance and antenna radiation efficiency are maintained at −16 dB or higher in a mid band (e.g., area 700) when the right side is gripped (e.g., reference numeral 702) and when the left side is gripped (e.g., reference numeral 703).

Figure 8A:
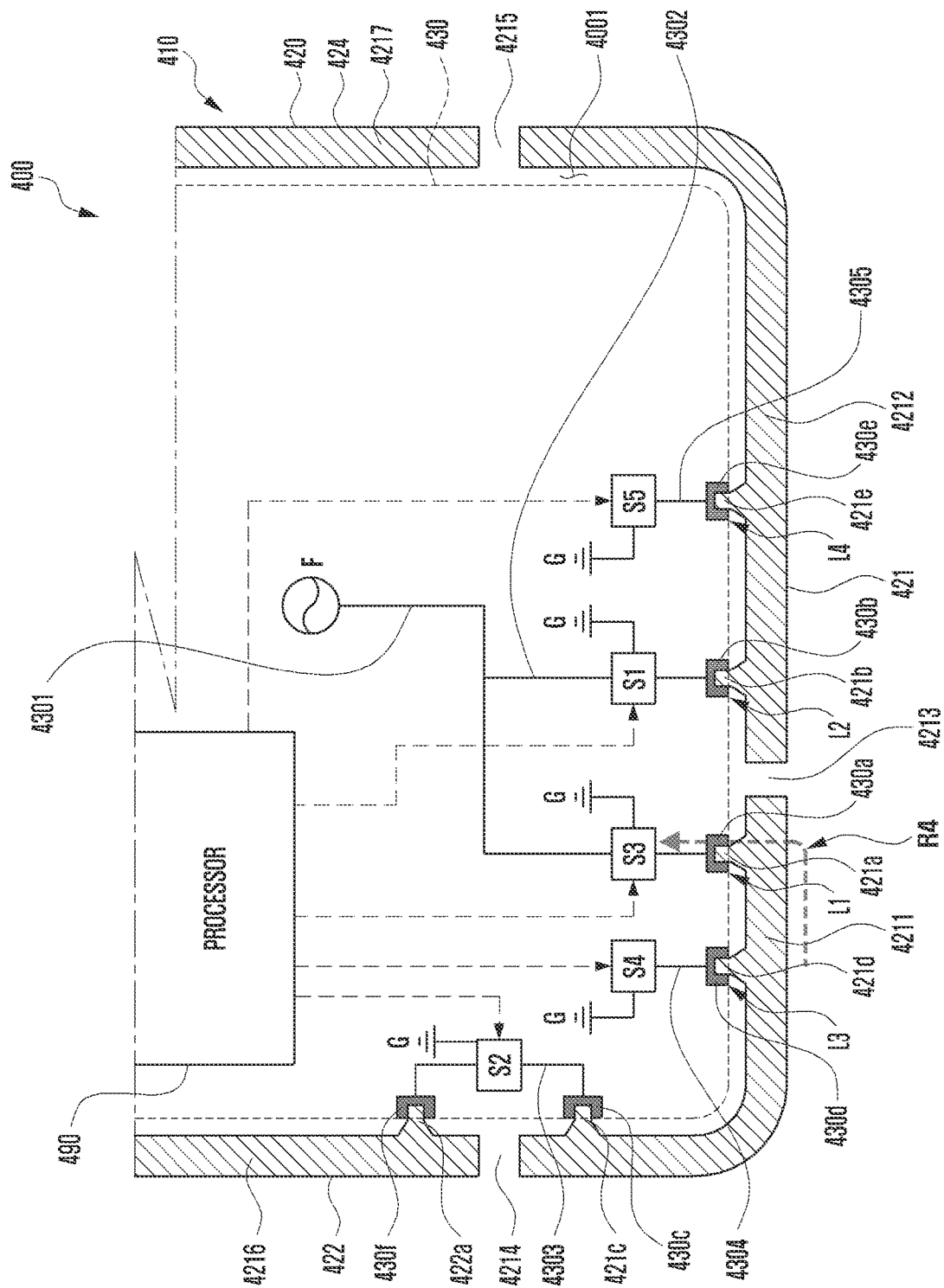
FIG. 8A illustrates an antenna radiation flow in a high band according to an embodiment of the disclosure.

FIG. 8A illustrates an antenna radiation flow in a high band according to an embodiment of the disclosure.

Referring to FIG. 8A, the wireless communication circuit F may be configured to transmit and/or receive radio signals in a high band through the first conductive portion 4211 electrically connected through the first electric path 4301. According to an embodiment, the second conductive portion 4212 may be electrically connected to the ground G of the substrate 430 through the first switching circuit S1. According to an embodiment, electric length R4 of the first conductive portion 4211 may be adjusted through the fourth switching circuit S4. According to an embodiment, the first conductive portion 4211 and the third conductive portion 4216 may control the state of electric connection between the first conductive portion 4211 and the third conductive portion 4216 through the second switching circuit S2, thereby reducing radiation performance degradation during gripping. For example, when the first conductive portion 4211 operates in a high band by using the fourth switching circuit S4, the second switching circuit S2 may be controlled such that the first conductive portion 4211 and the third conductive portion 4216 are electrically connected, if the second non-conductive portion 4214 is gripped.

Figure 8B:
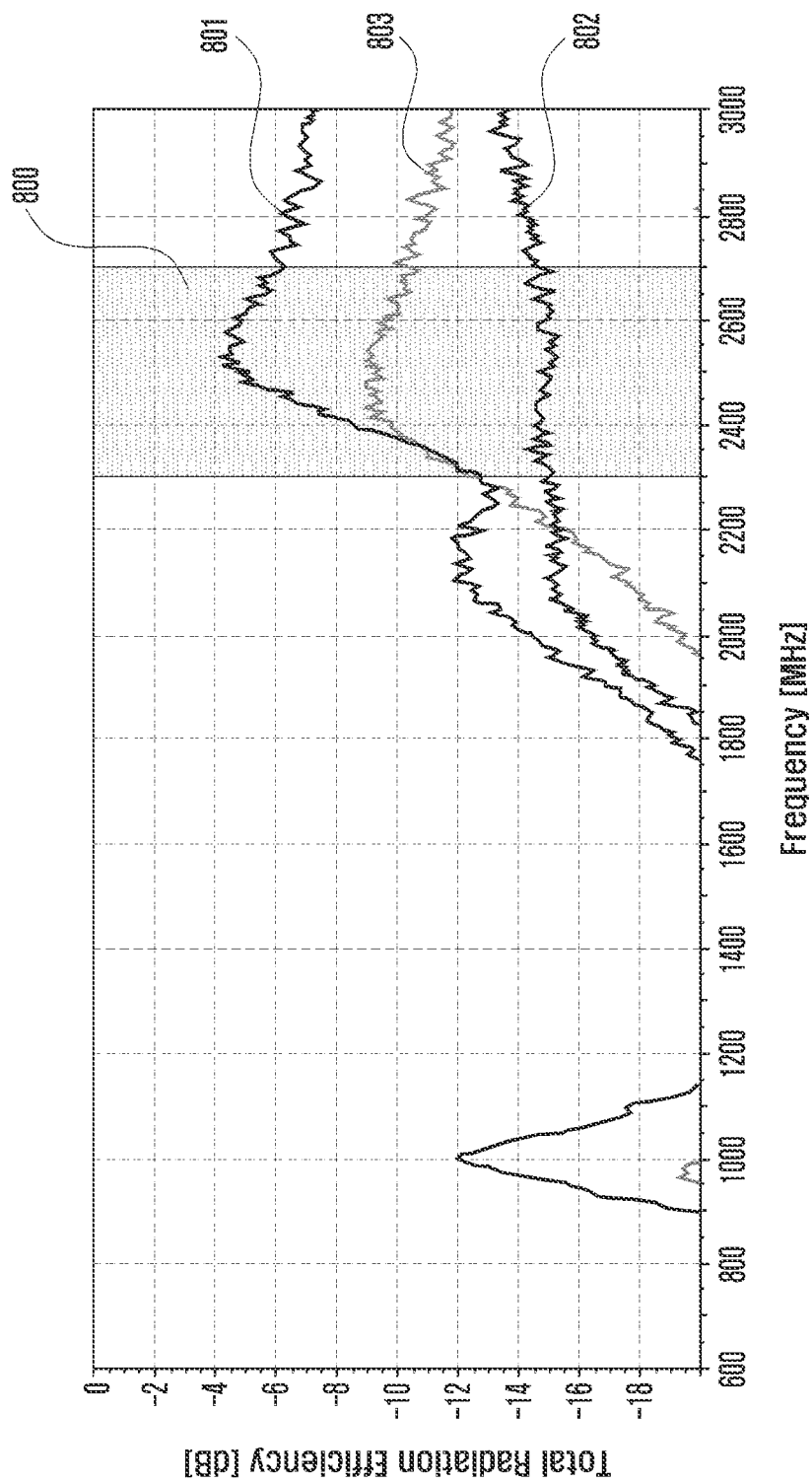
FIG. 8B is a graph showing antenna radiation performance in a high band, when an electronic device is gripped, according to an embodiment of the disclosure.

FIG. 8B is a graph illustrating antenna radiation performance in a high band, when the electronic device is gripped, according to an embodiment of the disclosure. Reference numeral 801 indicates antenna radiation performance in a free state without gripping, reference numeral 802 indicates antenna radiation performance when the right side, for example, the third non-conductive portion 4215 is gripped, and reference numeral 803 indicates antenna radiation performance when the left side, for example, the second non-conductive portion 4214 is gripped.

As illustrated, it is clear that, when the first conductive portion 4211 and the third conductive portion 4216 are electrically connected through the second switching circuit S2, the antenna resonance and antenna radiation efficiency are maintained at −16 dB or higher in a high band (e.g., area 800) when the right side is gripped (e.g., reference numeral 802) and when the left side is gripped (e.g., reference numeral 803).

Figure 9A:
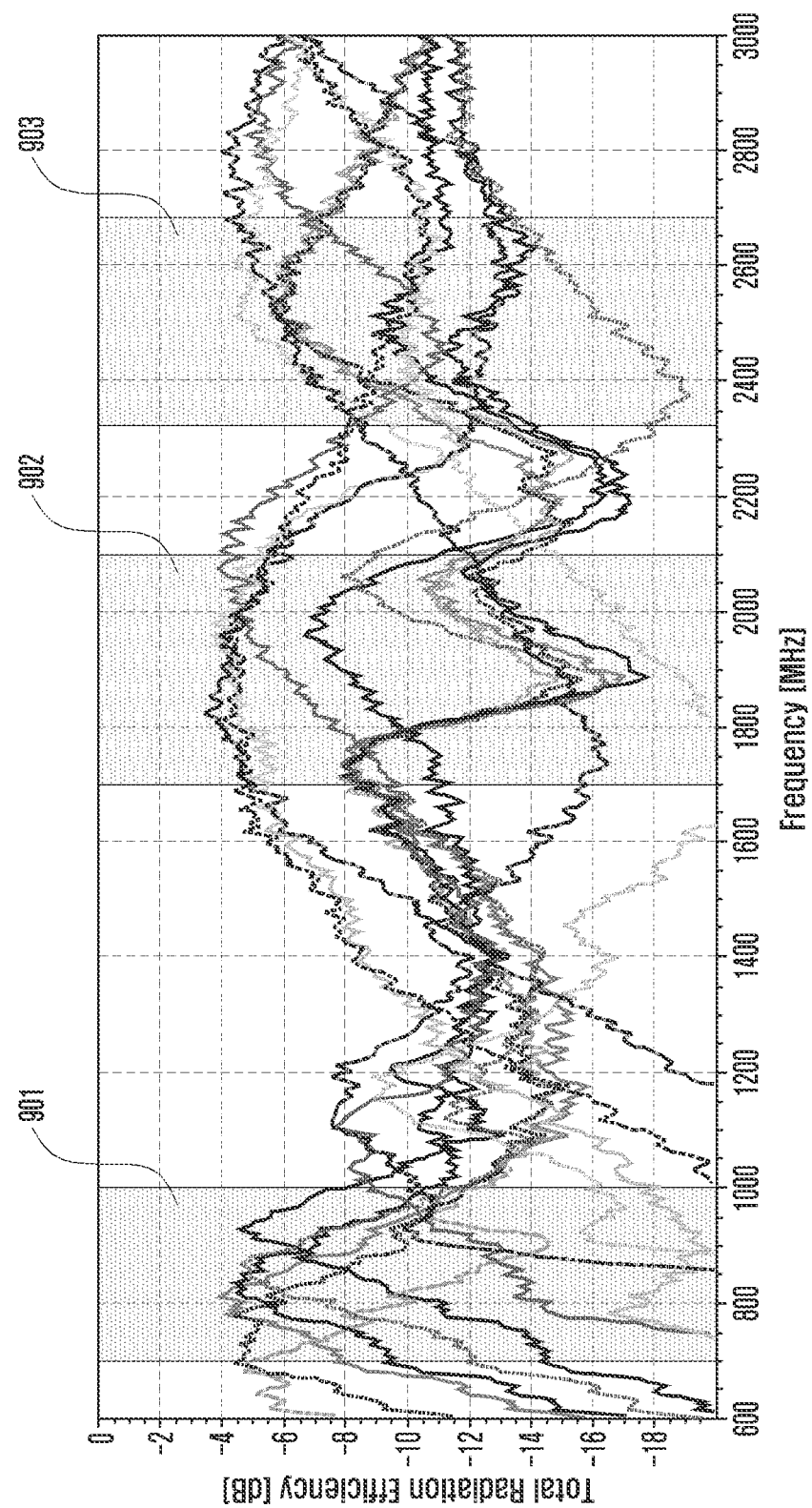
FIG. 9A is a graph showing antenna radiation performance in multiple bands according to an embodiment of the disclosure.
Figure 9B:
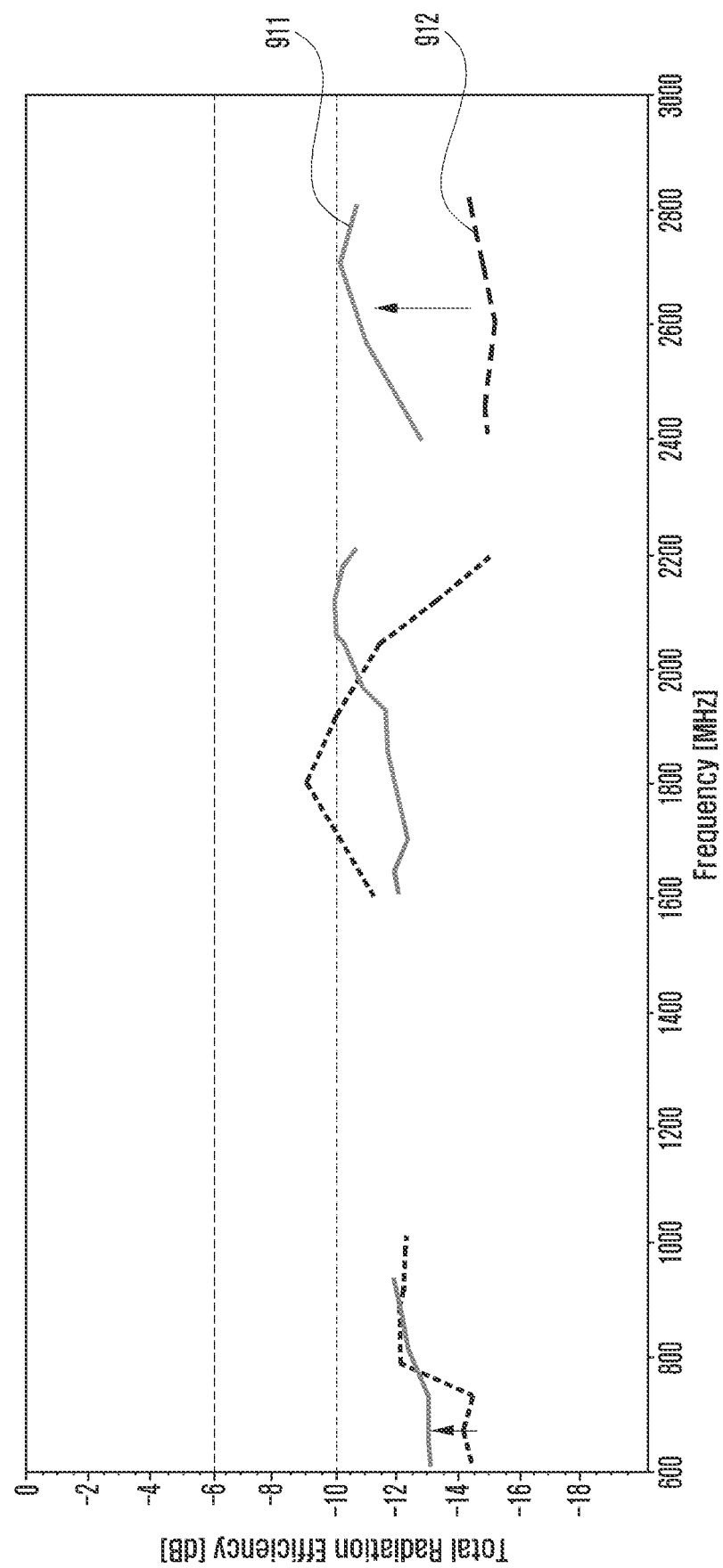
FIG. 9B is a graph showing a comparison of antenna radiation performance, when an electronic device is gripped, according to whether a second switching circuit exists or not, according to an embodiment of the disclosure.

FIG. 9A is a graph showing antenna radiation performance in multiple bands according to an embodiment of the disclosure. FIG. 9B is a graph showing a comparison of antenna radiation performance, when an electronic device is gripped, according to whether a second switching circuit (e.g., second switching circuit S2) exists or not, according to an embodiment of the disclosure.

According to various embodiments of the disclosure, the antenna may operate in a low band through dual feeding of the first conductive portion 4211 and the second conductive portion 4212, and in a mid band and/or a high band (multiple bands) through the first conductive portion 4211. In this case, the first conductive portion 4211 and the third conductive portion 4216 may be in a capacitively coupled state through the second switching circuit S2 such that the antenna electrically disconnects the first conductive portion 4211 and the third conductive portion 4216 in the low band, thereby using ground radiation via dual feeding, and electrically connects the first conductive portion 4211 and the third conductive portion 4216 through the second switching circuit S2 in the mid band and/or the high band, thereby reducing radiation degradation due to gripping.

FIG. 9A is a graph showing radiation efficiency of the antenna in FIG. 5A as the element value of the second switching circuit S2 changes, and it is clear that −6 dB or higher is maintained in the low band (e.g., area 901), and −16 dB or higher is maintained in the mid band (e.g., area 902) and the high band (e.g., area 903).

FIG. 9B is a graph showing a comparison of antenna radiation performance, when the second non-conductive portion 4214 is gripped, for example, according to whether the second switching circuit S2 exists or not, and it is clear that the antenna radiation performance is improved in the low band and the high band when the second switching circuit S2 is applied (e.g., reference numeral 911), compared with when no second switching circuit S2 exists (e.g., reference numeral 912).

According to various embodiments, an electronic device (e.g., electronic device 400 in FIG. 5A) may include a housing (e.g., housing 410 in FIG. 5A), a lateral member (e.g., lateral member 420 in FIG. 5A) disposed on at least a part of the housing, the lateral member including a first side surface (e.g., first side surface 421 in FIG. 5A), a second side surface (e.g., second side surface 422 in FIG. 5A) extending from an end of the first side surface perpendicularly, a third side surface (e.g., fourth side surface 424 in FIG. 5A) extending from a different end of the first side surface in parallel with the second side surface, a first conductive portion (e.g., first conductive portion 4211 in FIG. 5A) disposed between a first non-conductive portion (e.g., first non-conductive portion 4213 in FIG. 5A) formed on the first side surface and a second non-conductive portion (e.g., second non-conductive portion 4214 in FIG. 5A) formed on the second side surface, a second conductive portion (e.g., second conductive portion 4212 in FIG. 5A) disposed between the first non-conductive portion and a third non-conductive portion (e.g., third non-conductive portion 4215 in FIG. 5A) formed on the third side surface, and a third conductive portion (e.g., third conductive portion 4216 in FIG. 5A) facing the first conductive portion with the second non-conductive portion interposed therebetween, on the second side surface, a substrate (e.g., substrate 430 in FIG. 5A) disposed in an inner space (e.g., inner space 4001 in FIG. 5A) of the housing, and including a ground (e.g., ground G in FIG. 5A), a wireless communication circuit (e.g., wireless communication circuit F in FIG. 5A) disposed on the substrate and electrically connected to a first point (e.g., first point L1 in FIG. 5A) on the first conductive portion through a first electric path (e.g., first electric path 4301 in FIG. 5A), a first switching circuit (e.g., first switching circuit S1 in FIG. 5A) disposed on a second electric path (e.g., second electric path 4302 in FIG. 5A) electrically connecting the wireless communication circuit to a second point (e.g., second point L2 in FIG. 5A) on the second conductive portion, a second switching circuit (e.g., second switching circuit S2 in FIG. 5A) disposed on a third electric path (e.g., third electric path 4303 in FIG. 5A) connecting the first conductive portion and the third conductive portion, and at least one processor (e.g., processor 490 in FIG. 5A) configured to control the first switching circuit and/or the second switching circuit, based on state information of the electronic device.

According to various embodiments, the second non-conductive portion and the third non-conductive portion may be disposed to have left/right symmetry with reference to the first side surface.

According to various embodiments, the electronic device may include a third switching circuit disposed on the first electric path between the first point and the first switching circuit, and electrically connected to the ground.

According to various embodiments, the third switching circuit may include multiple passive elements having different element values and a switch configured to connect one passive element among the multiple passive elements to the second electric path.

According to various embodiments, the electronic device may include a fourth switching circuit disposed on a fourth electric path connecting the ground and a third point on the first conductive portion, which is farther from the first non-conductive portion than the first point.

According to various embodiments, the fourth switching circuit may include multiple passive elements having different element values and a switch configured to connect one passive element among the multiple passive elements to the fourth electric path.

According to various embodiments, the electronic device may include a fifth switching circuit disposed on a fifth electric path connecting the ground and a fourth point on the second conductive portion, which is farther from the first non-conductive portion than the second point.

According to various embodiments, the fifth switching circuit may include multiple passive elements having different element values and a switch configured to connect one passive element among the multiple passive elements to the fifth electric path.

According to various embodiments, the wireless communication circuit may be configured to transmit and/or receive radio signals in a first frequency band by using the first conductive portion connected to the first point and the second conductive portion connected to the second point, through the first switching circuit.

According to various embodiments, the first conductive portion and the third conductive portion may be electromagnetically disconnected through the second switching circuit.

According to various embodiments, the first frequency band may include a low band.

According to various embodiments, the wireless communication circuit may be configured to transmit and/or receive radio signals in at least one second frequency band by using the first conductive portion connected to the first point, through the first switching circuit.

According to various embodiments, the first conductive portion and the third conductive portion may be electromagnetically connected through the second switching circuit.

According to various embodiments, the at least one second frequency band may include a mid band and/or a high band.

According to various embodiments, a first electric length from the first point to the second non-conductive portion and a second electric length from the second point to the second non-conductive portion may be configured to be substantially identical.

According to various embodiments, the electronic device may include a sub-substrate which is disposed in the vicinity of the substrate, and which includes the third electric path electrically connecting the first conductive portion and the third conductive portion, and the sub-substrate may be electrically connected to the substrate through the flexible substrate.

According to various embodiments, the second switching circuit may be disposed on the third electric path of the sub-substrate.

According to various embodiments, the second electric path may branch off from the first electric path.

According to various embodiments, the housing may include a front cover which is coupled to the lateral member, and which faces in a first direction, and a rear cover facing in a second direction opposite to the first direction. The electronic device may include a display disposed in the inner space to be visible from the outside through at least a part of the front cover. When the front cover is seen from above, at least a part of the display may be disposed to overlap at least a part of the lateral member.

According to various embodiments, the first switching circuit and the second switching circuit may include multiple passive elements having different element values and a switch configured to connect one of the multiple passive elements to the second electric path and the third electric path, respectively.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing;
   a lateral member disposed on at least a part of the housing, the lateral member comprising:
     a first side surface,
     a second side surface extending perpendicularly from a first end of the first side surface,
     a third side surface extending from a second end of the first side surface and being parallel to the second side surface, the second end being different from the first end,
     a first conductive portion disposed between a first non-conductive portion formed on the first side surface and a second non-conductive portion formed on the second side surface,
     a second conductive portion disposed between the first non-conductive portion and a third non-conductive portion formed on the third side surface, and
     a third conductive portion disposed on the second side surface and facing the first conductive portion with the second non-conductive portion interposed therebetween;
   a substrate disposed in an inner space of the housing and comprising a ground;
   a wireless communication circuit disposed on the substrate and electrically connected to a first point on the first conductive portion through a first electric path;
   a first switching circuit disposed on a second electric path electrically connecting the wireless communication circuit to a second point on the second conductive portion;
   a second switching circuit disposed on a third electric path connecting the first conductive portion to the third conductive portion; and
   at least one processor configured to, based on state information of the electronic device, control at least one of the first switching circuit or the second switching circuit.

2. The electronic device of claim 1, wherein the second non-conductive portion and the third non-conductive portion have left/right symmetry with respect to the first side surface.

3. The electronic device of claim 1, further comprising:
a third switching circuit disposed on the first electric path between the first point and the first switching circuit, the third switching circuit being electrically connected to the ground.

4. The electronic device of claim 3, wherein the third switching circuit comprises:
multiple passive elements having different element values; and
a switch configured to connect one passive element among the multiple passive elements to the second electric path.

5. The electronic device of claim 1, further comprising:
a fourth switching circuit disposed on a fourth electric path connecting the ground to a third point on the first conductive portion, the third point on the first conductive portion being farther from the first non-conductive portion than the first point.

6. The electronic device of claim 5, wherein the fourth switching circuit comprises:
multiple passive elements having different element values; and
a switch configured to connect one passive element among the multiple passive elements to the fourth electric path.

7. The electronic device of claim 1, further comprising:
a fifth switching circuit disposed on a fifth electric path connecting the ground to a fourth point on the second conductive portion, the fourth point on the second conductive portion being farther from the first non-conductive portion than the second point.

8. The electronic device of claim 7, wherein the fifth switching circuit comprises:
multiple passive elements having different element values; and
a switch configured to connect one passive element among the multiple passive elements to the fifth electric path.

9. The electronic device of claim 1, wherein the wireless communication circuit is configured to at least one of transmit or receive radio signals in a first frequency band by using the first conductive portion connected to the first point and the second conductive portion connected to the second point, through the first switching circuit.

10. The electronic device of claim 9, wherein the first conductive portion and the third conductive portion are electromagnetically disconnected through the second switching circuit.

11. The electronic device of claim 9, wherein the first frequency band comprises a low band.

12. The electronic device of claim 1, wherein the wireless communication circuit is configured to at least one of transmit or receive radio signals in at least one second frequency band by using the first conductive portion connected to the first point, through the first switching circuit.

13. The electronic device of claim 12, wherein the first conductive portion and the third conductive portion are electromagnetically connected through the second switching circuit.

14. The electronic device of claim 12, wherein the at least one second frequency band comprises at least one of a mid band or a high band.

15. The electronic device of claim 1, wherein a first electric length from the first point to the second non-conductive portion and a second electric length from the second point to the third non-conductive portion are identical.

16. The electronic device of claim 1, further comprising:
a sub-substrate disposed to be spaced apart from the substrate, and which includes the third electric path electrically connecting the first conductive portion and the third conductive portion,
wherein the sub-substrate is electrically connected to the substrate through a flexible substrate.

17. The electronic device of claim 16, wherein the second switching circuit is disposed on the third electric path of the sub-substrate.

18. The electronic device of claim 1, wherein the second electric path is branches off from the first electric path.

19. The electronic device of claim 1,
wherein the housing includes a front cover which is coupled to the lateral member, and which faces in a first direction, and a rear cover facing in a second direction opposite to the first direction,
wherein the electronic device includes a display disposed in the inner space to be visible from outside through at least a part of the front cover, and
wherein at least a part of the display is disposed to overlap at least a part of the lateral member when the front cover is seen from above.

20. The electronic device of claim 1, wherein the first switching circuit and the second switching circuit include multiple passive elements having different element values and a switch configured to connect one of the multiple passive elements to the second electric path and the third electric path, respectively.

* * * * *